United States Patent
Hayashi et al.

(10) Patent No.: US 9,761,764 B2
(45) Date of Patent: *Sep. 12, 2017

(54) LIGHT EMITTING DEVICE

(71) Applicant: NICHIA CORPORATION, Anan-shi (JP)

(72) Inventors: Masaki Hayashi, Anan (JP); Yuki Shiota, Tokushima (JP); Junya Narita, Yoshinogawa (JP); Keisuke Kurashita, Anan (JP); Takanori Akaishi, Tokushima (JP); Motohisa Kitani, Tokushima (JP)

(73) Assignee: NICHIA CORPORATION, Anan-shi (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/005,005

(22) Filed: Jan. 25, 2016

(65) Prior Publication Data

US 2016/0233390 A1 Aug. 11, 2016

(30) Foreign Application Priority Data

Feb. 5, 2015 (JP) .................................. 2015-021016

(51) Int. Cl.
*H01L 33/00* (2010.01)
*H01L 33/48* (2010.01)
(Continued)

(52) U.S. Cl.
CPC ............ *H01L 33/486* (2013.01); *H01L 33/20* (2013.01); *H01L 25/0753* (2013.01); *H01L 33/38* (2013.01);
(Continued)

(58) Field of Classification Search
CPC ...................................................... H01L 33/486
See application file for complete search history.

(56) References Cited

U.S. PATENT DOCUMENTS 7,338,823 B2 3/2008 Han et al.
7,527,400 B2 5/2009 Yamamoto et al.
(Continued)

FOREIGN PATENT DOCUMENTS

JP 11-340576 12/1999
JP 2000-261038 9/2000
(Continued)

OTHER PUBLICATIONS

Japanese Office Action for corresponding JP Application No. 2015-021016, Dec. 6, 2016.
(Continued)

*Primary Examiner* — Jamie C Niesz
(74) *Attorney, Agent, or Firm* — Mori & Ward, LLP

(57) ABSTRACT

A light emitting device includes a package and at least one light emitting element. The package includes a recess portion which has a bottom surface, an opening on a front side opposite to the bottom surface in a front direction vertical to the bottom surface, and an inner peripheral wall connecting the bottom surface and the front side. The bottom surface has distances between opposite sides of the bottom surface and has a longest distance among the distances. The at least one light emitting element is disposed on the bottom surface of the recess portion and has a polygonal shape which has five or more sides and which has a longest diagonal line viewed along the front direction. Each internal angle of the polygonal shape is less than 180°. The longest diagonal line of the polygonal shape is parallel to a lateral line along the longest distance.

18 Claims, 11 Drawing Sheets

(51) Int. Cl.
*H01L 33/20* (2010.01)
*H01L 25/075* (2006.01)
*H01L 33/38* (2010.01)

(52) U.S. Cl.
CPC ............. *H01L 2224/48091* (2013.01); *H01L 2224/48247* (2013.01); *H01L 2224/73265* (2013.01); *H01L 2224/92247* (2013.01); *H01L 2924/181* (2013.01)

(56) References Cited

U.S. PATENT DOCUMENTS

| | | | |
|---|---|---|---|
| 9,472,735 B2* | 10/2016 | Ichikawa | H01L 33/486 |
| 2002/0063258 A1 | 5/2002 | Motoki | |
| 2006/0163602 A1* | 7/2006 | Isokawa | H01L 33/60 257/100 |
| 2007/0176193 A1 | 8/2007 | Nagai | |
| 2008/0123344 A1 | 5/2008 | Shiraishi et al. | |
| 2009/0008654 A1 | 1/2009 | Nagai | |
| 2010/0073917 A1* | 3/2010 | Loh | B29C 45/1671 362/97.3 |
| 2010/0258825 A1 | 10/2010 | Ohta et al. | |
| 2011/0133235 A1 | 6/2011 | Hoshino et al. | |
| 2014/0306230 A1* | 10/2014 | Chen | H01L 33/20 257/76 |
| 2015/0214451 A1* | 7/2015 | Abe | F21S 4/28 362/382 |
| 2016/0240518 A1* | 8/2016 | Hayashi | H01L 25/0753 |

FOREIGN PATENT DOCUMENTS

| | | |
|---|---|---|
| JP | 2003-249112 | 9/2003 |
| JP | 2005-005433 | 1/2005 |
| JP | 2005-260276 | 9/2005 |
| JP | 2006-086469 | 3/2006 |
| JP | 2006-135309 | 5/2006 |
| JP | 2006-156837 | 6/2006 |
| JP | 2006-203058 | 8/2006 |
| JP | 2006-222248 | 8/2006 |
| JP | 2008-016565 | 1/2008 |
| JP | 2008-072074 | 3/2008 |
| JP | 2008-118024 | 5/2008 |
| JP | 2009-071174 | 4/2009 |
| JP | 2009-302314 | 12/2009 |
| JP | 2010-245481 | 10/2010 |
| JP | 2011-124323 | 6/2011 |
| JP | 2011-233808 | 11/2011 |
| JP | 2012-023249 | 2/2012 |
| JP | 2012-028452 | 2/2012 |
| JP | 2012-119481 | 6/2012 |
| JP | 2014-027213 | 2/2014 |
| WO | WO 2006/068297 | 6/2006 |
| WO | WO 2014/049973 | 4/2014 |

OTHER PUBLICATIONS

Japanese Office Action for corresponding JP Application No. 2015-021016, Apr. 11, 2017 (w/ machine translation).

* cited by examiner

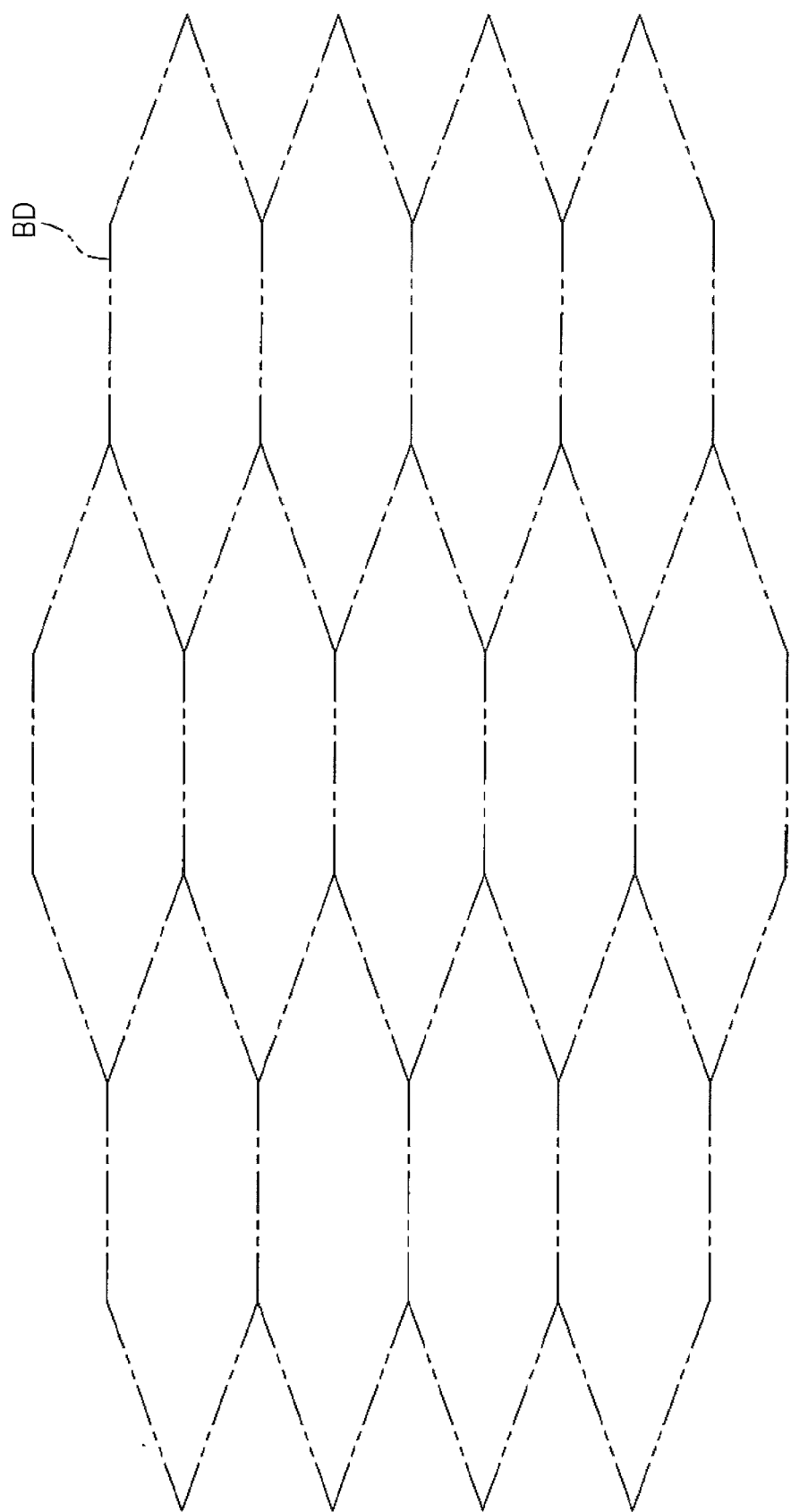

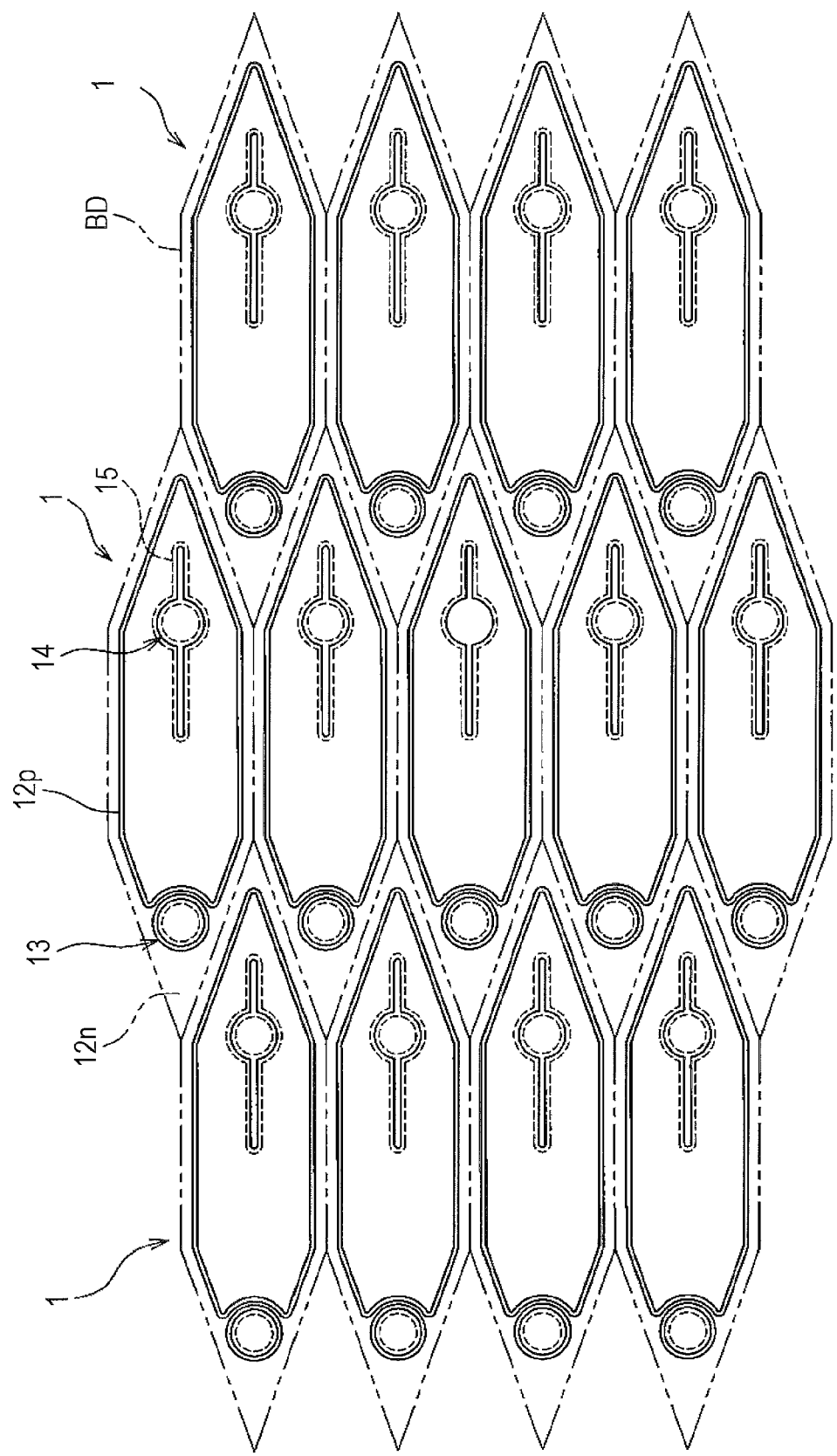

US 9,761,764 B2

LIGHT EMITTING DEVICE

CROSS-REFERENCE TO RELATED APPLICATIONS

The present application claims priority under 35 U. S. C. §119 to Japanese Patent Application No. 2015-021016, filed Feb. 5, 2015. The contents of this application are incorporated herein by reference in their entirety.

BACKGROUND

Technical Field

The present disclosure relates to a light emitting device.

Discussion of the Background

Japanese Unexamined Patent Application Publication No. 2005-5433 discloses an optical semiconductor device (light emitting device). In this device, one or a plurality of planarly square-shaped light emitting elements are provided in a recess portion of a resin package to be rotated by 45° around an axis vertical to a disposition surface.

SUMMARY OF THE INVENTION

According to one aspect of the present invention, a light emitting device includes a package and at least one light emitting element. The package includes a recess portion which has a bottom surface, an opening on a front side opposite to the bottom surface in a front direction vertical to the bottom surface, and an inner peripheral wall connecting the bottom surface and the front side. The bottom surface has distances between opposite sides of the bottom surface and has a longest distance among the distances. The at least one light emitting element is disposed on the bottom surface of the recess portion and has a polygonal shape which has five or more sides and which has a longest diagonal line viewed along the front direction. Each internal angle of the polygonal shape is less than 180°. The at least one light emitting element is disposed such that the longest diagonal line of the polygonal shape is parallel to a lateral line along the longest distance.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 7A is a schematic plan view illustrating boundary lines for virtually laying out a wafer, in a light emitting element preparing step in the method of manufacturing the light emitting device according to the first embodiment;

FIG. 7B is a schematic plan view illustrating a state where the light emitting elements are formed on the wafer, in the light emitting element preparing step in the method of manufacturing the light emitting device according to the first embodiment;

DESCRIPTION OF THE EMBODIMENTS

Figure 1:
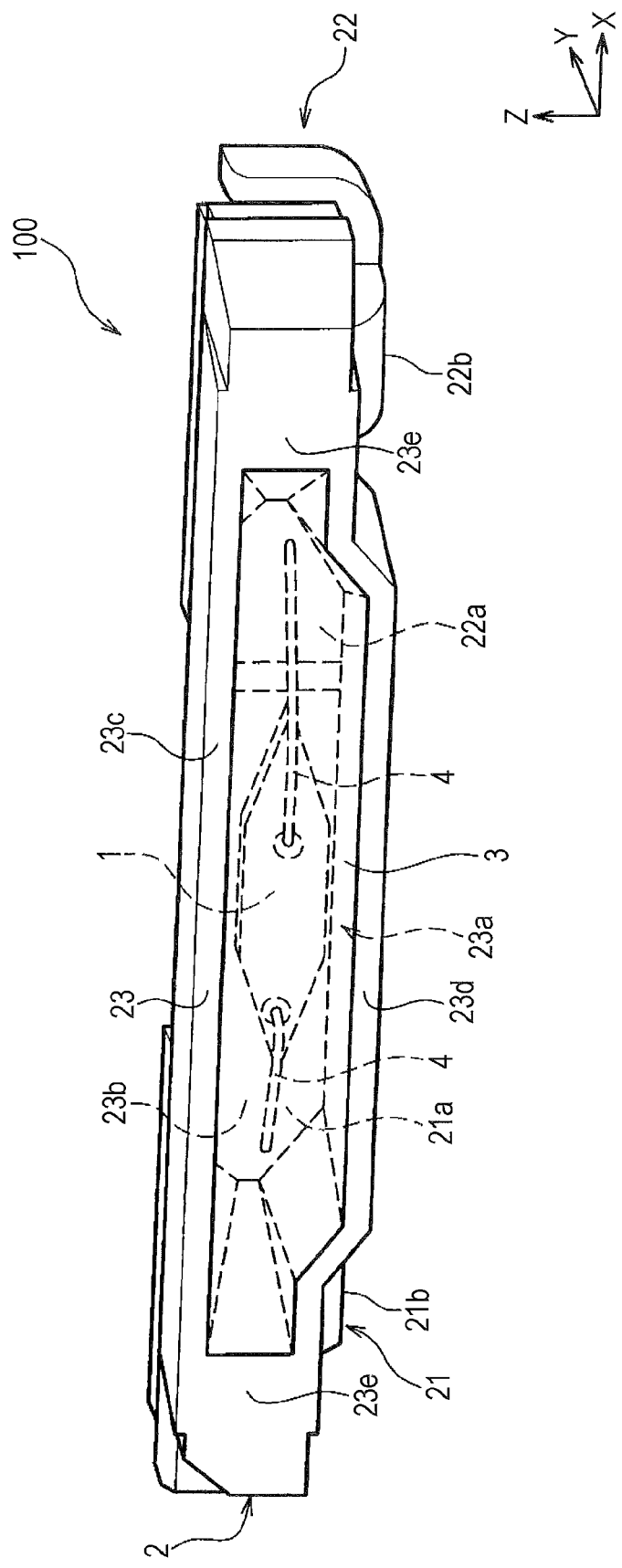
FIG. 1 is a schematic perspective view illustrating a configuration of a light emitting device according to a first embodiment.

The embodiments will now be described with reference to the accompanying drawings, wherein like reference numerals designate corresponding or identical elements throughout the various drawings.

Hereinafter, a description will be given of a light emitting device according to embodiments and a method of manufacturing the light emitting device.

Furthermore, the drawing to be used in the following description only schematically illustrates the embodiment, so that a scale, a distance, and a positional relationship among members are exaggerated, or the member is partially not illustrated in some cases. In addition, the scale or the distance in the members differs between a plan view and its cross-sectional view in some cases. Furthermore, in the following description, the same title or same reference represents the same or similar member in general, so that detailed description for it is omitted.

Furthermore, in the description of the light emitting device in this embodiment and the method of manufacturing the same, terms "upper", "lower", "left", and "right" are exchanged according to circumstances. In this specification, the term "upper" or "lower" represent a relative position between components in the drawing to be used for the description, and do not represent an absolute position unless otherwise noted.

First Embodiment
Configuration of Light Emitting Device

Figure 2A:
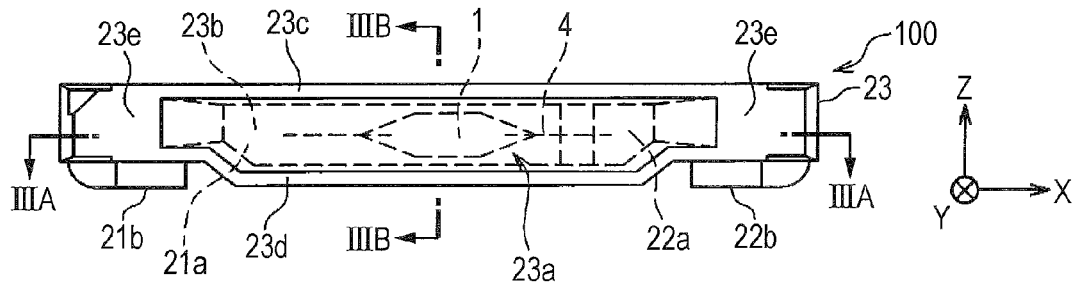
FIG. 2A is a schematic front view illustrating a configuration of the light emitting device according to the first embodiment.
Figure 2B:
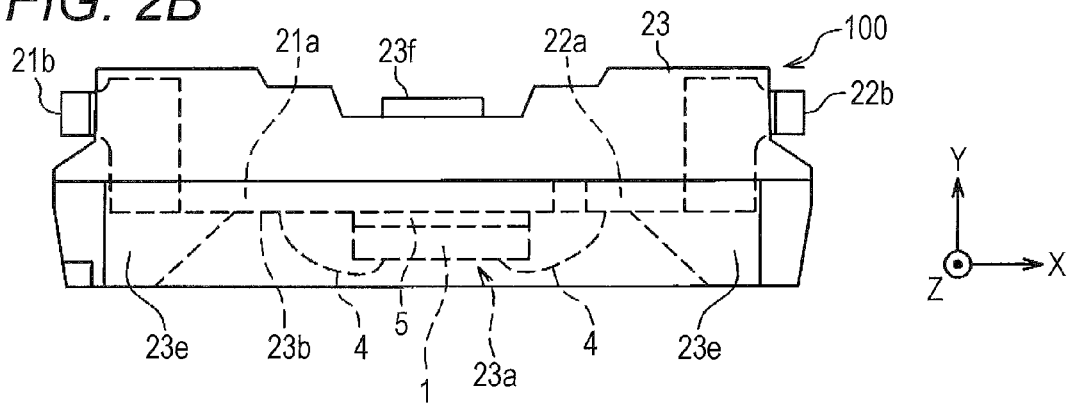
FIG. 2B is a schematic plan view illustrating a configuration of the light emitting device according to the first embodiment.
Figure 2C:
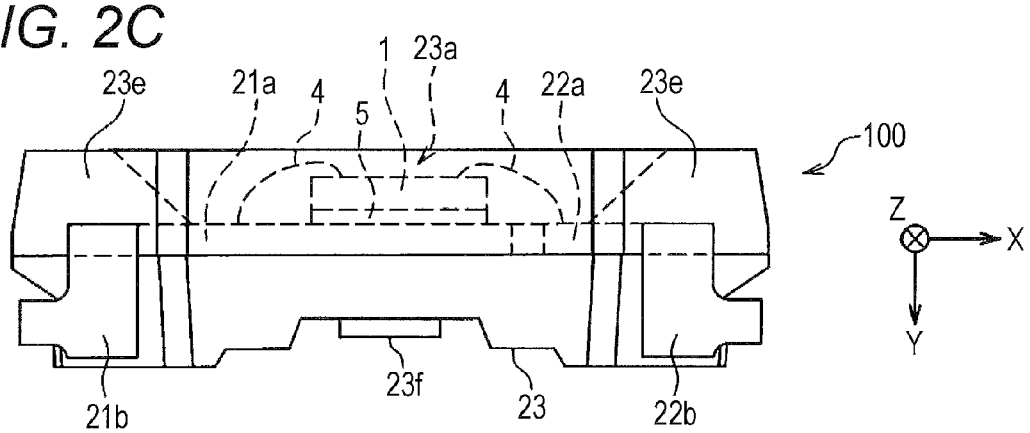
FIG. 2C is a schematic bottom view illustrating a configuration of the light emitting device according to the first embodiment.
Figure 2D:
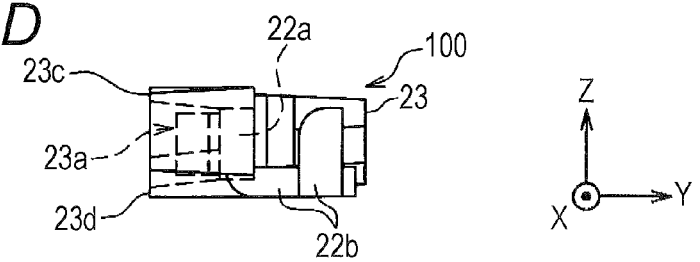
FIG. 2D is a schematic right-side view illustrating a configuration of the light emitting device according to the first embodiment.
Figure 3A:
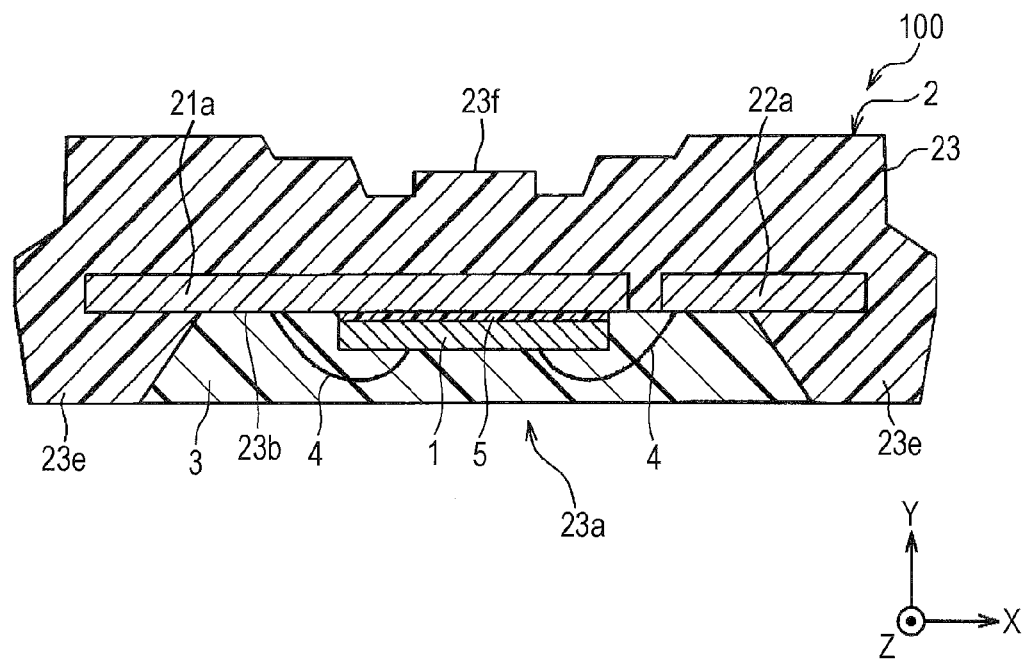
FIG. 3A is a schematic cross-sectional view, taken along line IIIA-IIIA in FIG. 2A, illustrating a configuration of the light emitting device according to the first embodiment.
Figure 3B:
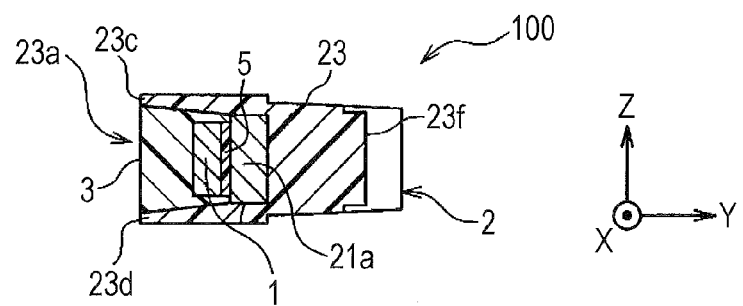
FIG. 3B is a schematic cross-sectional view, taken along line IIIB-IIIB in FIG. 2A, illustrating a configuration of the light emitting device according to the first embodiment.

The configuration of the light emitting device according to the first embodiment will be described with reference to FIGS. 1 to 3B. FIG. 1 is a schematic perspective view illustrating a configuration of the light emitting device according to the first embodiment. FIG. 2A is a schematic front view illustrating a configuration of the light emitting device according to the first embodiment. FIG. 2B is a schematic plan view illustrating a configuration of the light emitting device according to the first embodiment. FIG. 2C is a schematic bottom view illustrating a configuration of the light emitting device according to the first embodiment. FIG. 2D is a schematic right-side view illustrating a configuration of the light emitting device according to the first embodiment. FIG. 3A is a schematic cross-sectional view, taken along line IIIA-IIIA in FIG. 2A, illustrating a configuration of the light emitting device according to the first embodiment. FIG. 3B is a schematic cross-sectional view, taken along line IIIB-IIIB in FIG. 2A, illustrating a configuration of the light emitting device according to the first embodiment.

In addition, coordinate axes are illustrated in each of FIGS. 1 to 3B, in which FIG. 2A is the schematic front view taken toward a positive direction of Y axis, FIG. 2B is the schematic plan view (top view) taken toward a negative direction of Z axis, FIG. 2C is the schematic bottom view taken toward a positive direction of Z axis, and FIG. 2D is the schematic right-side view taken toward a negative direction of X axis, for descriptive purposes.

The light emitting device 100 according to the first embodiment includes a light emitting element 1 and a package 2.

The light emitting element 1 is provided in a recess portion 23a having an opening in a front surface of the package 2, and electrically connected to internal lead portions 21a and 22a of lead electrodes 21 and 22 through wires 4. The light emitting element 1 is bonded to a bottom surface 23b of the recess portion 23a with a die bond resin 5. Furthermore, a light-transmissive sealing resin 3 is provided in the recess portion 23a to seal the light emitting element 1.

Furthermore, light from the light emitting element 1 is emitted from the opening of the recess portion 23a in a front direction (negative direction of Y axis) through the light-transmissive sealing resin 3. The light emitting device 100 is formed to be flat in a thickness direction (Z axis direction) so as to be suitably used as a light source for a backlight of a liquid crystal display, for example.

The light emitting element 1 is bonded to the one-polar internal lead portion 21a provided on the bottom surface 23b (surface vertical to Y axis) of the recess portion 23a in the package 2, with the die bond resin 5. In addition, positive and negative pad electrodes (positive electrode and negative electrode) of the light emitting element 1 are electrically connected to the internal lead portions 21a and 22a each having the corresponding polarity, with the bonding wire 4 made of Au, Ag, Cu, Al, or the like.

Furthermore, only one light emitting element 1 is mounted in this example, a plurality of the light emitting elements 1 may be mounted. The plurality of light emitting elements may emit the same color or different colors.

Furthermore, according to this embodiment, since the light emitting device 100 is a side-view type (side surface light emission type), the light emitting element 1 is mounted such that a principal surface of a substrate 11 of the light emitting element 1 intersects at right angle with an upper surface of the light emitting device 100. In the description for the configuration of the light emitting element 1 in this specification, "the light emitting element 1 in planer view" means that it is viewed from a normal direction of the principal surface of the substrate 11, for descriptive purposes. Therefore, under the condition that the light emitting element 1 is mounted in the light emitting device 100, a planar surface (top surface) of the light emitting element 1 is a surface observed in the front view of the light emitting device 100.

Hereinafter, a configuration example of the light emitting element 1 will be described with reference to FIGS. 4A to 4C.

Figure 4A:
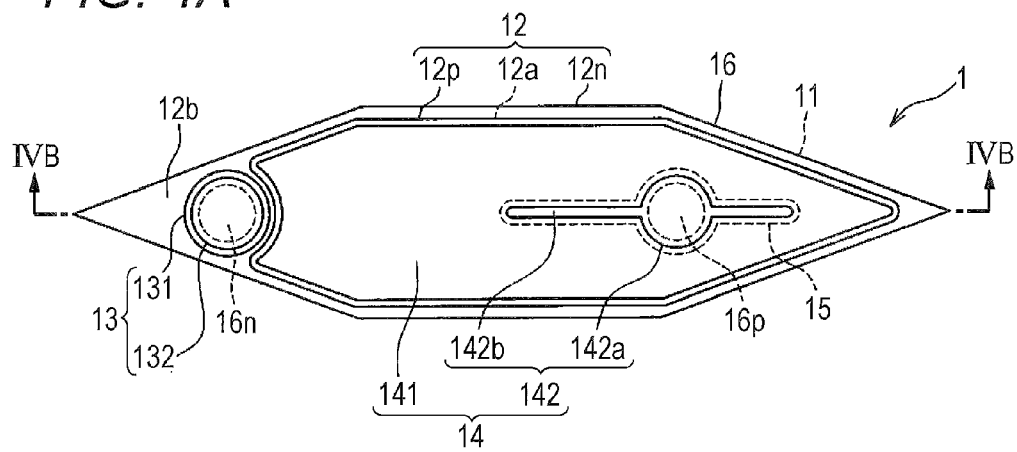
FIG. 4A is a schematic plan view illustrating a configuration of a light emitting element in the light emitting device according to the first embodiment.

FIG. 4A is a schematic plan view illustrating a configuration of the light emitting element in the light emitting device according to the first embodiment. FIG. 4B is a schematic cross-sectional view, taken along line IVB-IVB in FIG. 4A, illustrating a configuration of the light emitting element in the light emitting device according to the first embodiment. FIG. 4C is a schematic view for describing a shape of the light emitting element in planar view in the light emitting device according to the first embodiment.

The light emitting element 1 may be suitably used as a semiconductor light emitting element such as an LED. The light emitting element 1 in this embodiment has a horizontally long hexagonal shape in planar view, and includes the substrate 11, a semiconductor stacked body 12, an n-side electrode 13, a p-side electrode 14, an insulating film 15, and a protective film 16. More specifically, the light emitting element 1 in this embodiment includes the semiconductor stacked body 12 having a light emitting diode (LED) structure, on the one principal surface of the substrate 11, and includes the n-side electrode 13 and the p-side electrode 14 formed on one surface of the semiconductor stacked body 12, so that the light emitting element 1 has a structure suitable for face-up type mounting.

Figure 4B:
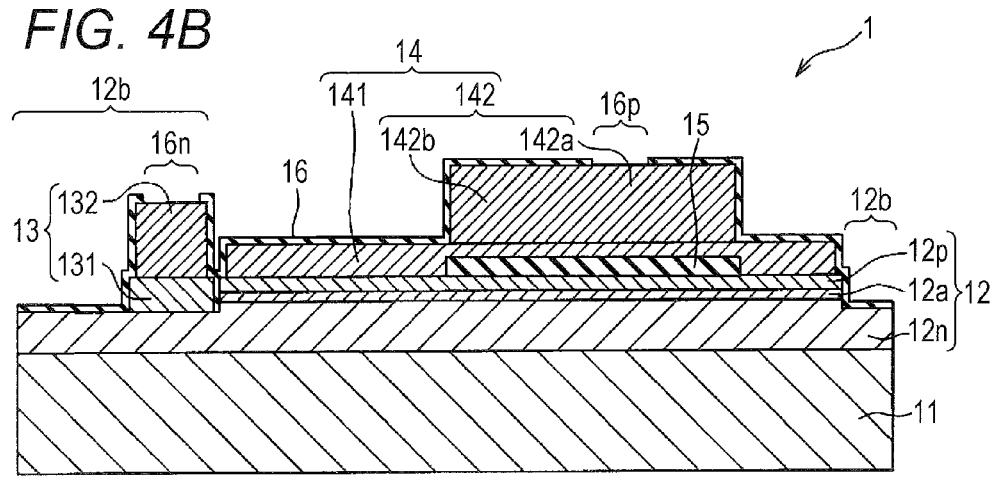
FIG. 4B is a schematic cross-sectional view, taken along line IVB-IVB in FIG. 4A, illustrating a configuration of the light emitting element of the light emitting device according to the first embodiment.
Figure 4C:
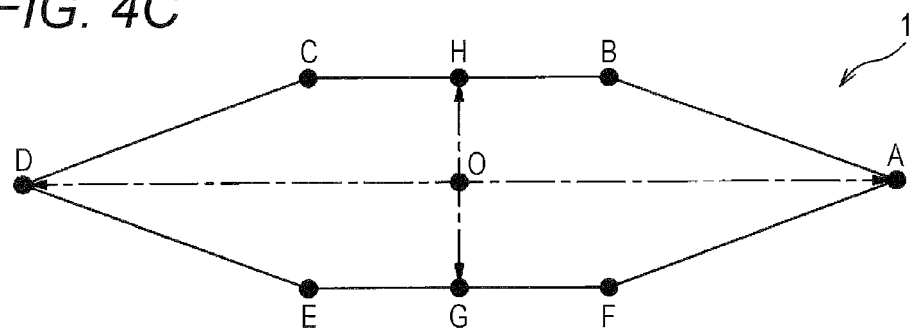
FIG. 4C is a schematic view for describing a shape of the light emitting element in planar view in the light emitting device according to the first embodiment.

The shape of the light emitting element 1 in planar view is a hexagon and as illustrated in FIG. 4C, the light emitting element 1 has a convex hexagonal shape in which an internal angle of each of apexes A to F of the hexagon is less than 180°. Furthermore, three pairs of opposite sides are each parallel to each other. In addition, a direction parallel to a diagonal line AD corresponds to a long-side direction of the light emitting element 1, and a direction perpendicular to the diagonal line AD corresponds to a short-side direction thereof. Furthermore, the six sides have an equal length.

According to this embodiment, sides BC and EF are parallel to the diagonal line AD, and a line segment GH from a middle point H of the side BC to a middle point G of the side EF intersects at right angle with the diagonal line AD at a center O. Therefore, a length of the line segment GH corresponds to a length of the light emitting element 1 in the short-side direction.

The substrate 11 is suitable for epitaxially growing the semiconductor stacked body 12. For example, in a case where the semiconductor stacked body 12 is made of a nitride semiconductor such as nitride gallium (GaN), the substrate 11 may be an insulating substrate made of sapphire or spinel ($MgAl_2O_4$) having a C surface, R surface, or A surface as a principal surface, or an oxide substrate made of lithium niobate or neodymium gallate which makes a lattice junction with silicon carbide (SiC), ZnS, ZnO, Si, GaAs, diamond, and nitride semiconductor.

The semiconductor stacked body 12 is formed on the one principal surface serving as an upper surface of the substrate 11 and includes an n-type semiconductor layer 12n and a p-type semiconductor layer 12p, and light is emitted from the semiconductor stacked body 12 when a current flows between the n-side electrode 13 and the p-side electrode 14. The semiconductor stacked body 12 preferably includes an active layer 12a between the n-type semiconductor layer 12n and the p-type semiconductor layer 12p.

The semiconductor stacked body 12 has a step difference portion 12b in which the p-type semiconductor layer 12p and the active layer 12a are not partially provided, that is, the p-type semiconductor layer 12p is recessed. That is, a bottom surface of the step difference portion 12b is the n-type semiconductor layer 12n. According to this embodiment, the step difference portion 12b is provided around an outer edge portion of the light emitting element 1, and the step difference portion 12b is larger in a left end portion than other portions. The n-side electrode 13 is provided in a part of the bottom surface of the step difference portion 12b provided in the left end portion, and electrically connected to the n-type semiconductor layer 12n.

Furthermore, a light-transmissive electrode 141 is provided as a lower layer of the p-side electrode 14, on a substantially entire upper surface of the p-type semiconductor layer 12p, and a pad electrode 142 is provided on a part of an upper surface of the light-transmissive electrode 141. In addition, an insulating film 15 is provided between the p-type semiconductor layer 12p and the light-transmissive electrode 141, in a region right under the pad electrode 142 and its vicinity in planar view.

Furthermore, surfaces of the semiconductor stacked body 12, the n-side electrode 13, and the p-side electrode 14 are covered with a protective film 16 except for external connection portions of a pad electrode 132 and the pad electrode 142.

The semiconductor stacked body 12 is preferably formed such that semiconductors such as ZnS, SiC, GaN, GaP, InN, AlN, ZnSe, GaAsP, GaAlAs, InGaN, GaAlN, AlInGaP, and AlInGaN are stacked on the substrate by a method such as liquid phase growth method, HDVPE method, or MOCVD method. As the semiconductor material, gallium nitride-based semiconductor expressed by $In_XAl_YGa_{1-X-Y}N$ ($0 \leq X$, $0 \leq Y$, $X+Y<1$) is preferably used because wavelengths of light from ultraviolet light to infrared light can be variously selected by selecting a mixed crystal ratio.

The n-side electrode 13 is provided on the bottom surface of the step difference portion 12b in the semiconductor stacked body 12 so as to be electrically connected to the n-type semiconductor layer 12n and serves as a negative electrode for externally supplying a current to the light emitting element 1. Furthermore, the n-side electrode 13 has a stacked structure including a light reflecting film 131 and the pad electrode 132.

The lower light reflecting film 131 reflects light which tries to enter a lower surface of the n-side electrode 13 after it has traveled in the semiconductor stacked body 12 to prevent the n-side electrode 13 from absorbing the light, so that external light extraction efficiency can be improved. Therefore, the light reflecting film 131 preferably has light reflectivity higher than at least a lower surface of the pad electrode 132, against a wavelength of the light emitted from the semiconductor stacked body 12, and it may be made of a metal such as Al, Ru, Ag, Ti, or Ni, or an alloy containing any of the metal as a main component.

The upper pad electrode 132 is provided to be connected to an external power supply. The pad electrode 132 may be made of metal such as Cu or Au, or an alloy containing any of the metal as a main component so as to be suitable for the external connection by a method such as wire bonding.

The p-side electrode 14 is provided on the upper surface of the p-type semiconductor layer 12p so as to be electrically connected to the p-type semiconductor layer 12p, and serves as a positive electrode for externally supplying a current to the light emitting element 1. Furthermore, the p-side electrode 14 has a stacked structure including the light-transmissive electrode 141 and the pad electrode 142.

The lower light-transmissive electrode 141 is provided so as to cover the substantially entire upper surface of the p-type semiconductor layer 12p. The light-transmissive electrode 141 functions as a current diffusing layer for diffusing the current which is externally supplied through the pad electrode 142, into all over the p-type semiconductor layer 12p. Furthermore, the light from the semiconductor stacked body 12 is mostly externally extracted through the light-transmissive electrode 141. Thus, the light-transmissive electrode 141 preferably has a high light transmissivity with respect to the light wavelength emitted from the semiconductor stacked body 12.

The light-transmissive electrode 141 is made of electrically conductive metal oxide. The electrically conductive metal oxide includes an oxide containing at least one element selected from a group consisting of zinc (Zn), indium (In), tin (Sn), gallium (Ga), and titanium (Ti). More specifically, the electrically conductive metal oxide includes ZnO, AZO (Al-doped ZnO), IZO (In-doped ZnO), GZO (Ga-doped ZnO), $In_2O_3$, ITO (Sn-doped $In_2O_3$), IFO (F-doped $In_2O_3$), $SnO_2$, ATO (Sb-doped $SnO_2$), FTO (F-doped $SnO_2$), CTO (Cd-doped $SnO_2$), and $TiO_2$.

Among them, ITO is preferably used to cover the substantially entire upper surface of the p-type semiconductor layer 12p because it has a high light transmissivity with respect to visible light (visible region) and high electrical conductivity.

The upper pad electrode 142 is provided in a part of the upper surface of the light-transmissive electrode 141 to be connected to an external electrode. Furthermore, the pad electrode 142 includes an external connection portion 142a to be externally connected by wire bonding, and an extension portion 142b which extends from the external connection portion 142a toward a center and periphery to diffuse the current more efficiently.

Similar to the pad electrode 132 of the n-side electrode 13, the pad electrode 142 may be made of metal such as Cu or Au, or an alloy containing any of the metal as a main component so as to be suitable for the external connection by a method such as wire bonding.

Furthermore, according to this embodiment, the external connection portion 142a and the extension portion 142b are both made of the same material, as the pad electrode 142.

The insulating film 15 is provided on the p-type semiconductor layer 12p, right under the pad electrode 142 and its vicinity so as to surround the pad electrode 142 in planar view. The insulating film 15 is provided between the p-type semiconductor layer 12p and the light-transmissive electrode 141, so that it can prevent a current from flowing in the p-type semiconductor layer 12p provided in a region right under the pad electrode 142, and can prevent light emission in that region. Thus, an amount of light traveling toward the pad electrode 142 is reduced, and thus an amount of light absorbed by the pad electrode 142 is reduced, so that light emission amount from the semiconductor stacked body 12 can be increased as a whole.

Furthermore, the insulating film 15 preferably has a light transmissivity and is made of material having a lower refractive index than the light-transmissive electrode 141. When the insulating film 15 is provided on the p-type semiconductor layer 12p, light travelling upward in the semiconductor stacked body 12 at an interface between the p-type semiconductor layer 12p and the insulating film 15 can be totally reflected based on the Snell's law. Therefore, when the insulating film 15 is provided right under the pad electrode 142 and its vicinity in planar view, the light is efficiently reflected before it travels toward the pad electrode 142, so that light absorption by the pad electrode 142 can be reduced.

The insulating film 15 is preferably made of oxide such as $SiO_2$, $TiO_2$, or $Al_2O_3$, nitride such as SiN, or fluoride such as MgF. Among them, $SiO_2$ is preferably used because its refractive index is low.

The protective film 16 has a light transmissivity and an insulating property, and covers the substantially entire upper surface and side surface of the light emitting element 1 except for a side surface and a lower surface of the substrate 11. Furthermore, the protective film 16 has an opening 16n in an upper surface of the pad electrode 132, and has an opening 16p in an upper surface of the pad electrode 142.

The protective film 16 may be made of the same material as the insulating film 15 and $SiO_2$ is preferably used.

Furthermore, in the light emitting element 1, positions of the n-side electrode 13, the p-side electrode 14, and the step difference portion 12b, or the shapes of the pad electrodes 132 and 142 are not limited to those described in this embodiment, and may be appropriately changed. Furthermore, the n-side electrode 13 may also have an extension portion.

With reference to FIGS. 1 to 3B again, the configuration of the light emitting device 100 will be further described.

The package 2 includes the lead electrodes 21 and 22, and a resin portion 23. The package 2 has a roughly cuboidal outer shape formed to be flat in the Z axis direction, that is, in the thickness direction of the light emitting device 100. Thus, the package 2 is suitable for the side-view mounting which is preferably used in the light source for the backlight of the liquid crystal display, for example.

The lead electrode 21 and the lead electrode 22 are a pair of negative and positive electrodes. The lead electrodes 21 and 22 are provided in the resin portion 23 and include the internal lead portions 21a and 22a serving as a mounting portion of the light emitting element 1 and external lead portions 21b and 22b projecting from a bottom surface of the resin portion 23 and serving as terminals to be connected to a mounting substrate.

The lead electrodes 21 and 22 are made of plate-shaped metal, and may have the form of a plate that undulates or a plate that has bumps. In addition, the lead electrodes 21 and 22 may have a uniform thickness, or may be thicker or thinner in portions.

The internal lead portions 21a and 22a are exposed in the bottom surface 23b (surface perpendicular to Y axis) of the recess portion 23a in the resin portion 23. The internal lead portions 21a and 22a are electrically isolated from each other, in the bottom surface 23b of the recess portion 23a. The light emitting element 1 is bonded to the internal lead portion 21a with the die bond resin under the condition that the semiconductor stacked body 12 is insulated from the internal lead portion 21a. Furthermore, the n-side electrode 13 and the p-side electrode 14 serving as a pair of electrodes in the light emitting element 1 are electrically connected to the negative and positive internal lead portions 21a and 22a, respectively with the bonding wire 4.

The external lead portions 21b and 22b are connected to the internal lead portions 21a and 22a having the corresponding polarities, respectively; project from the bottom surface of the resin portion 23; crookedly extend backward (a positive direction of Y axis) along the bottom surface of the resin portion 23; and partially crookedly extend upward (the positive direction of Z axis) along the right and left side surfaces of the resin portion 23.

The light emitting device 100 is mounted such that a bottom surface faces the mounting substrate, and the external lead portions 21b and 22b are bonded to a wiring pattern of the mounting substrate with an electrically conductive bonding member such as a solder.

The lead electrodes 21 and 22 may be made of any material, but they are preferably made of material having relatively high thermal conductivity. When such material is used, heat generated in the light emitting element 1 can be externally released through the external lead portions 21b and 22b with high efficiency. Examples of the material of the lead electrodes 21 and 22 preferably include a material having a thermal conductivity of about 200 W/(m·K) or more and a material having relatively high mechanical strength, or a material capable of being readily processed in a punching press process or an etching process. More specifically, the material includes a metal such as copper, aluminum, gold, silver, tungsten, iron, or nickel, or an alloy such as iron-nickel alloy or phosphor bronze. Furthermore, surfaces of the internal lead portions 21a and 22a exposed in the bottom surface 23b of the recess portion 23a are preferably plated with material having a high light reflectivity such as Ag in order to efficiently extract the light from the mounted light emitting element 1.

The resin portion 23 is provided so as to surround the internal lead portions 21a and 22a and serves as a base member of the package 2 for supporting the lead electrodes 21 and 22. The external lead portions 21b and 22b are connected to the internal lead portions 21a and 22a and project from the bottom surface of the resin portion 23. The external lead portions 21b and 22b crookedly extend along the bottom surface and the side surface of the resin portion 23.

The resin portion 23 has the recess portion 23a open in the front surface of the light emitting device 100 (the negative direction of Y axis). The internal lead portions 21a and 22a are exposed in the bottom surface 23b (surface having a normal vector in the negative direction of Y axis) of the recess portion 23a, and the light emitting element 1 is mounted on the surface of the internal lead portion 21a exposed from the resin portion 23.

Furthermore, a gate mark 23f is formed on a back surface of the resin portion 23 and this is a mark of a gate used for injecting a resin material into a die when the resin portion 23 is formed by an injection molding method.

The resin portion 23 contains light reflective particles added into a light-transmissive resin, so that it also functions as a light reflecting member which reflects the light from the light emitting element 1, in the recess portion 23a so as to efficiently emit the light in the front surface direction.

Furthermore, the light-transmissive sealing resin 3 is filled in the recess portion 23a.

The recess portion 23a has a horizontally long opening in front view. More specifically, the opening has a shape of octagon formed by expanding a center portion of a lower side of a rectangle downward so that a trapezoidal shape is formed along the lower side. Furthermore, the bottom surface 23b of the recess portion 23a has a horizontally long octagonal shape, and the internal lead portions 21a and 22a are provided on this bottom surface 23b. Furthermore, the recess portion 23a is surrounded by inner walls having an upper wall portion 23c and a lower wall portion 23d provided opposite in the thickness direction (Z axis direction) of the light emitting device 100, and two side wall portions 23e provided opposite in a width direction (X axis direction) of the light emitting device 100.

Here, the upper wall portion 23c and the lower wall portion 23d are thinner than the side wall portion 23e. Furthermore, the internal lead portions 21a and 22a provided on the bottom surface 23b of the recess portion 23a partially extend and reach an outer side surface of the lower wall portion 23d serving as the one thin wall portion, and then the external lead portions 21b and 22b serving as the external connection terminal project from that outer side surface, and crookedly extend along the lower surface of the resin portion 23.

As described above, according to the light emitting device 100, the lead electrodes 21 and 22 are provided suitably for side-view type mounting, and the resin portion 23 is provided to realize the thinner side-view type light emitting device 100.

Furthermore, each of the upper wall portion 23c, the lower wall portion 23d, and the side wall portion 23e has an inclined inner side surface so that the recess portion 23a expands from the bottom surface 23b of the recess portion 23a on which the light emitting element 1 is mounted toward the opening, that is, in a height direction (Z axis direction) or the width direction (X axis direction). Therefore, the light which has been emitted from the side surface (surface parallel to Y axis) of the light emitting element 1 and traveled toward the inner side surface of the recess portion 23a is reflected by this inclined inner side surface toward the front surface direction (the negative direction of Y axis).

In addition, the inner side surfaces of the upper wall portion 23c and the lower wall portion 23d may be substantially vertical surfaces with respect to the bottom surface 23b of the recess portion 23a, instead of the inclined surfaces in order to provide the thinner light emitting device 100.

A resin material for the resin portion 23 preferably has a high light transmissivity with respect to the wavelength of the light emitted from the light emitting element 1, and examples thereof include silicone resin, silicone modified resin, silicon hybrid resin, epoxy resin, epoxy modified resin, urea resin, phenol resin, polycarbonate resin, acrylic resin, polymethylpentene resin, polynorbornene resin, polyphthalamide resin, unsaturated polyester resin, polyester resin, liquid crystal resin, phlyphenylene ether resin, polyamide resin, or hybrid resin containing at least one kind of the resins. Among them, unsaturated polyester resin, polyester resin, and polyphthalamide resin are preferably used because they have a high light resistance and a high heat resistance. The polyamide resin includes polyamide 6T, polyamide 9T, polyamide 10T, polyamide 6C, and polyamide 9C.

Furthermore, as for the side-view type light emitting device 100, a distance is very small between the light emitting element 1 and the resin portion 23, and the resin portion 23 is irradiated with the light with high intensity, so that the resin material is required to have the light resistance. Therefore, among the resins, polyamide resin not containing a benzene ring in its chemical structure, such as polyamide 6C or polyamide 9C is preferably used because it is has a high light resistance and a high heat resistance.

An example of the light reflecting material contained in the resin portion 23 may preferably include particles that are made of a material having a large difference in refractive index from the resin material and having a high light transmissivity.

For example, the refractive index of the light reflecting material is preferably 1.8 or more, and in order to efficiently scatter the light to obtain the high light extraction efficiency, it is preferably 2.0 or more and more preferably 2.5 or more. For example, the difference in refractive index from the resin material is 0.4 or more, and in order to efficiently scatter the light to obtain the high light extraction efficiency, it is preferably 0.7 or more and more preferably 0.9 or more. An average diameter of the particle of the light reflecting material is preferably between 0.08 μm and 10 μm (inclusive) and more preferably 0.1 μm and 5 μm (inclusive) in order to obtain a light scattering effect with high efficiency.

Furthermore, in this specification, the value of the average diameter of the particle of the light reflecting material or a wavelength conversion material is obtained from observation with an electron microscope. The unidirectional diameter of the particle is measured as a length in a fixed axial direction, and a number criterion (number distribution) is used for measuring a size of the particle with the electron microscope (SEM, TEM).

More specifically, the light reflecting material may be white pigment particles of $TiO_2$ (titanium oxide), $ZrO_2$ (zirconium oxide), MgO (magnesium oxide), $MgCO_3$ (magnesium carbonate), $Mg(OH)_2$, (magnesium hydroxide), $CaCO_3$ (calcium carbonate), $Ca(OH)_2$ (calcium hydroxide), $CaSiO_3$ (calcium silicate), ZnO (zinc oxide), $BaTiO_3$ (barium titanate), or $Al_2O_3$ (aluminum oxide). Among them, $TiO_2$ is preferably used because it is relatively stable to water, and has a high refractive index and high heat conductivity.

Furthermore, in order to obtain the higher reflectivity, in a case where the light emitted from the light emitting element 1 is the visible light, $TiO_2$ is preferably used as the light reflecting material, and in a case where the light is the ultraviolet light, $M_2O_3$ is preferably used as the light reflecting material.

Furthermore, the light reflecting material is to be contained in the resin material to obtain the high light reflectivity and to the extent that moldability is not damaged when the shape of the package is formed. Thus, a content rate of the light reflecting material in the resin portion 23 is preferably between 10 mass % and 60 mass % (inclusive). When it is 10 mass % or more, the reflectivity of the resin can be high, and the light can be prevented from escaping from the resin portion 23, so that the light extraction efficiency can be improved in the light emitting device 100. In addition, when it is 60 mass % or less, the resin has a high fluidity, and a moldability can be high. In particular, the side-view type light emitting device 100 has the thin side wall, so that the resin needs to have a high fluidity. In order to improve the light extraction efficiency and to improve the moldability, the content rate of the light reflecting material in the resin portion 23 is more preferably between 20 mass % and 50 mass % (inclusive).

When a polygonal die is used, the light irradiation intensity to the resin portion 23 can be reduced, so that the resin material of the resin portion 23 can be prevented from deteriorating. Thus, a light diffusing material which reduces the resin strength can be contained in the resin material at a high concentration. When the polygonal die is used, the content rate of the light diffusing material is more preferably between 25 mass % and 50 mass % (inclusive).

The sealing resin 3 contains a light-transmissive resin material as a main component, and is filled in the recess portion 23a of the resin portion 23 to seal the light emitting element 1 mounted on the bottom surface 23b of the recess portion 23a. Furthermore, the sealing resin 3 may contain a wavelength conversion material (fluorescent material) to convert a wavelength of the light from the light emitting element 1 to a different wavelength of light. For example, in a case where the light emitting element 1 emits blue light and the wavelength conversion material partially converts the blue light to yellow light, white light as a mixed color can be emitted from the light emitting device 100.

Furthermore, several kinds of wavelength conversion materials may be contained in the sealing resin 3, and instead of the wavelength conversion material or in addition to it, a light diffusing material may be contained.

The resin material of the sealing resin 3 preferably has a high light transmissivity for the wavelength of the light from the light emitting element 1 and the wavelength of the light from the wavelength conversion material, and also has a high weather resistance, a high light resistance, and a high heat resistance as a sealing member. The resin material includes the same resin material as in the resin portion 23 or glass. Examples of the resin material of the sealing resin 3 include silicone resin, silicone modified resin, silicone hybrid resin, fluorine resin, fluorine modified resin, and adamantine resin. In particular, the silicone resin and the fluorine resin are preferable because they have a high heat resistance and a high light resistance.

Furthermore, as the wavelength conversion material (fluorescent material), a known material in this field may be used. For example, it includes yttrium-aluminum-garnet (YAG)-based fluorescent material which emits green to yellow light and is activated with cerium, lutetium-aluminum-garnet (LAG)-based fluorescent material which emits green light and is activated with cerium, nitrogen-containing calcium aluminosilicate ($CaO—Al_2O_3—SiO_2$)-based fluorescent material which emits green to red light and is activated with europium and/or chrome, silicate ($(Sr, Ba)_2SiO_4$)-based fluorescent material which emits blue to red light and is activated with europium, β-sialon fluorescent material expressed by $(Si, Al)_6(O,N)_8$: Eu which emits green light, sulfide-based fluorescent material expressed by $SrGa_2S_4$: Eu, nitride-based fluorescent material such as CASN series expressed by $CaAlSiN_3$: Eu, or SCASN series expressed by $(Sr, Ca)AlSiN_3$: Eu which emits red light, KSF ($K_2SiF_6$: Mn)-based fluorescent material which emits red light, and sulfide-based fluorescent material which emits red light.

The polygonal die has a large side surface area as compared with a rectangular die, so that the wavelength conversion material can be efficiently irradiated with the light from the light emitting element 1. Therefore, heat generation can be dispersed by dispersing the wavelength conversion material, and an amount of the wavelength conversion material to be used can be reduced, which reduces the deterioration of the wavelength conversion material, so that reliability of the light emitting device 100 can be improved. In particular, this is very effective to the light emitting device containing the sulfide-based, fluorine-based, or nitride-based fluorescent material which is easily deteriorated by heat, so that due to the reduction in heat generation and amount of the wavelength conversion material, the reliability of the light emitting device 100 can be improved.

More specifically, the light diffusing material to be contained in the sealing resin 3 may be white pigment particles of $SiO_2$, $TiO_2$, $ZrO_2$, $MgO$, $MgCO_3$, $Mg(OH)_2$, $CaCO_3$, $Ca(OH)_2$, $CaSiO_3$, $ZnO$, $BaTiO_3$, or $Al_2O_3$.

An average diameter of a particle of the light diffusing material to be contained in the sealing resin 3 is preferably between 0.001 μm and 10 μm (inclusive), thereby achieving a highly-efficient light scattering property. In particular, the average diameter of the particle of the light diffusing material in the sealing resin 3 is more preferably between 0.001 μm and 0.05 μm (inclusive). In this case, a high light scattering effect, that is, Rayleigh scattering effect can be obtained, so the light extraction efficiency can be more improved in the light emitting device 100.

Furthermore, the light extraction efficiency can be improved by combining the particles of the light diffusing material preferably having the average diameter of 0.001 μm to 0.05 μm, with the above described wavelength conversion material, that is, the nitride-based fluorescent material such as CASN series or SCASN series, the fluorine-based fluorescent material such as KSF series, or the sulfide-based fluorescent material. Furthermore, since the light extraction efficiency is improved, the amount of the wavelength conversion material can be reduced, so that a temperature rise due to the heat generation of the wavelength conversion material can be suppressed. As a result, the deterioration of the wavelength conversion material can be reduced, and the reliability can be improved in the light emitting device 100.

In particular, in the case where the light emitting element 1 is the polygonal die, the wavelength conversion material is the sulfide-based, fluoride-based, or nitride-based fluorescent material, and the light diffusing material has the average diameter of 0.001 μm to 10 μm in the light emitting device 100, the sealing resin 3 and the fluorescent material can be prevented from deteriorating, and the light extraction efficiency can be improved.

The wire 4 electrically connects the pad electrode 132 of the n-side electrode 13 and the pad electrode 142 of the p-side electrode 14 in the light emitting element 1, to the negative and positive internal lead portions 21a and 22a, respectively. The wire 4 may be made of metal such as Au, Cu, Al, or Ag, or alloy containing any of the metal as a main component.

The die bond resin 5 serves as a bonding member for bonding the light emitting element 1 to the internal lead portion 21a provided on the bottom surface 23b of the recess portion 23a.

A resin material of the die bond resin 5 preferably hardly discolors or deteriorates due to the light and heat from the light emitting element 1, and preferably has a high light transmissivity and has a refractive index equal to or lower than that of the sealing resin 3. When the refractive index of the die bond resin 5 is equal to or lower than the refractive index of the sealing resin 3, the light emitted from the light emitting element 1 through the die bond resin 5 can be efficiently externally extracted without being totally reflected at an interface between the die bond resin 5 and the sealing resin 3. The resin material is preferably a silicone-based die bond resin having a siloxane skeleton. The silicone-based die bond resin includes silicone resin, silicone hybrid resin, and silicone modified resin.

In particular, the polygonal die can be more effectively combined with the silicone die bond resin having the refractive index equal to or lower than that of the sealing resin 3. Since the polygonal die has the large side surface area as compared with the rectangular die, the more light is emitted from the light emitting element 1, so that the light can be more efficiently extracted to the outside. In particular, in the case of the polygonal die, the die bond resin 5 is preferably the silicone die bond resin having a refractive index lower than that of the sealing resin 3.

Operation of Light Emitting Device

Figure 5:
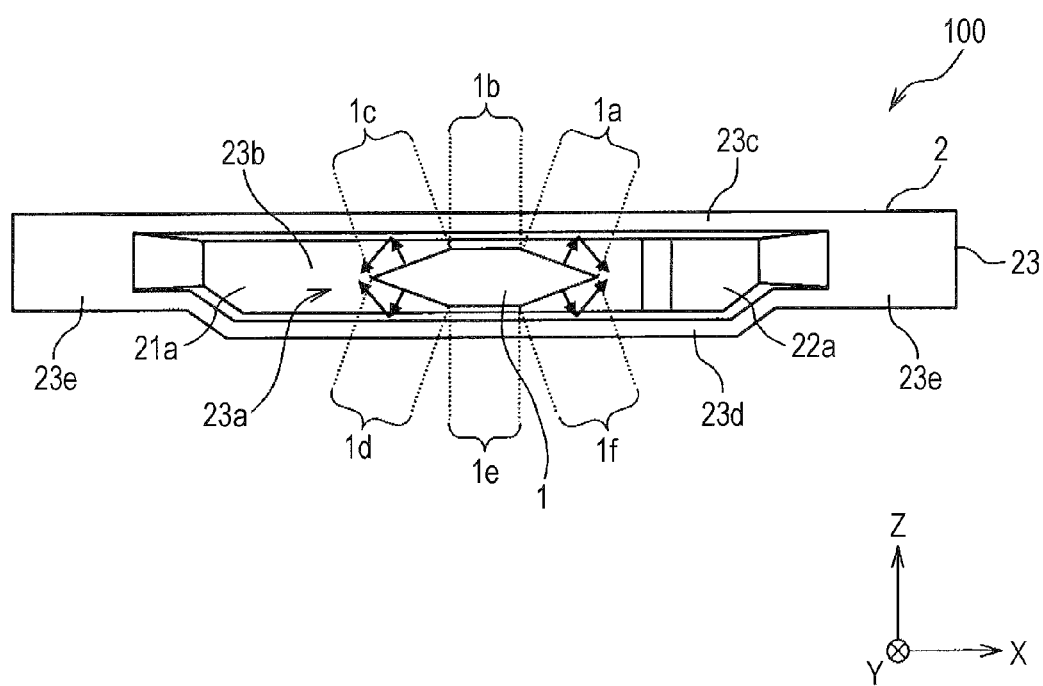
FIG. 5 is a schematic front view for describing light extraction from a side surface of the light emitting element in the light emitting device according to the first embodiment.

Hereinafter, the operation of the light emitting device 100 will be described with reference to FIGS. 2A to 5. FIG. 5 is a schematic front view of the light emitting device according to the first embodiment to describe light extraction from the side surface of the light emitting element 1. In FIG. 5, the detailed structure of the light emitting element 1, the external lead portions 21b and 22b, and the wire 4 are not illustrated.

Furthermore, the description will be given assuming that the light emitting element 1 emits blue light, and the sealing resin 3 contains a wavelength conversion material which absorbs the blue light and emits yellow light for descriptive purposes.

When the light emitting device 100 is connected to the external power supply through the external lead portions 21b and 22b, a current is supplied to the light emitting element 1 through the internal lead portions 21a and 22a and the wire 4, whereby the light emitting element 1 emits the blue light. The blue light from the light emitting element 1 is partially converted to the yellow light by the wavelength conversion material while it travels in the sealing resin 3. Thus, the light is partially reflected and partially absorbed at an interface between the members of the light emitting element 1 in the recess portion 23a, the die bond resin 5, internal lead portions 21a and 22a, the resin portion 23, and the sealing resin 3, and finally white light as a mixed color light of the blue light and the yellow light is emitted from the opening surface of the recess portion 23a in the package 2.

More specifically, the light emitted from the side surface of the light emitting element 1 travels in the vertical direction (Z axis direction) or the horizontal direction (X axis direction) in the sealing resin 3 and reaches the upper wall portion 23c, the lower wall portion 23d, or the side wall portion 23e. The above light is partially reflected toward the front direction (−Y axis direction). When the light which travels toward the bottom surface 23b of the recess portion 23a in the light emitting element 1 is reflected by an interface between the substrate 11 and the die bond resin 5 or by the bottom surface 23b of the recess portion 23a, the light is partially returned to the light emitting element 1 or partially travels in the die bond resin 5 in the horizontal direction and extracted to the outside through the sealing resin 3.

In addition, as for the light which has reached the upper wall portion 23c, the lower wall portion 23d, or the side wall portion 23e, the light is partially absorbed by the upper wall portion 23c, the lower wall portion 23d, or the side wall portion 23e. In particular, as for the thin package 2, distances between the side surfaces of the light emitting element 1, and the upper wall portion 23c and the lower wall portion 23d cannot be largely provided, so that the amount of irradiation light on the upper wall portion 23c and the lower wall portion 23d increases. Thus, the absorbed light amount increases in accordance with the amount of irradiation light, so that the upper wall portion 23c and the lower wall portion 23d are more likely to deteriorate.

Referring to FIG. 5 illustrating the front view, the light emitting element 1 is disposed so that the long-side direction of the outer shape of the hexagon is substantially parallel to the long-side direction of the bottom surface 23b of the recess portion 23a, and a side 1a (side AB), a side 1b (side BC), and a side 1c (side CD) are opposed to an upper side of the bottom surface 23b of the recess portion 23a, and a side 1d (side DE), a side 1e (side EF), and a side 1f (side FA) are opposed to a lower side of the bottom surface 23b of the recess portion 23a.

Thus, when the light emitting element 1 is disposed on the bottom surface 23b of the recess portion 23a, the sides 1a and 1c among the sides 1a, 1b, and 1c are opposed to but not parallel to the upper side of the bottom surface 23b, and the sides 1d and 1f among the sides 1d, 1e, and 1f are opposed to but not parallel to the lower side of the bottom surface 23b.

In addition, in this specification, the "parallel" or "substantially parallel" between the long-side direction of the light emitting element 1 and the long-side direction of the bottom surface 23b of the recess portion 23a includes a case where an inclined angle from a parallel line is within 10°.

Since the sides 1a and 1c are inclined, irradiation intensity of the light from the side surfaces of the sides 1a and 1c of the light emitting element 1 which are not parallel to the upper side of the bottom surface 23b, to the inner side surface of the upper wall portion 23c is lower than irradiation intensity of the light from the side surface of the side 1b of the light emitting element 1 which is parallel to the upper side of the bottom surface 23b, to the inner side surface of the upper wall portion 23c.

Furthermore, the light emitted from the side surfaces of the sides 1a and 1c to the inner side surface of the upper wall portion 23c is more likely to be reflected by the inner side surface toward the side surfaces of the sides 1a and 1c in an oblique direction, so that the light is not likely to be repeatedly reflected between the side surface of the light emitting element 1 and the inner side surface of the upper wall portion 23c. As a result, the light can be readily extracted to the outside.

Furthermore, as the longer distance is provided between the side surface of the light emitting element 1 and the inner side surface of the upper wall portion 23c, the irradiation light intensity toward the upper wall portion 23c is further reduced because the light is diffused by the light diffusing material or its wavelength is converted by the wavelength conversion material when the light travels in the sealing resin 3 between the side surface of the light emitting element 1 and the inner side surface of the upper wall portion 23c.

In addition, as for the light emitted from the side surfaces of the sides 1d, 1e, and 1f of the light emitting element 1 to the lower wall portion 23d, they have the same relationship as that of the light emitted from side surfaces of the sides 1a, 1b, and 1e of the light emitting element 1 to the upper wall portion 23c.

Furthermore, when the outer shape of the light emitting element 1 is a convex polygonal having five or more sides, as compared with a case where a light emitting element having a square outer shape is rotated by 45° around an axis vertical to a principal surface and disposed, a ratio of an area of the light emitting element can be increased in an allocated disposition area.

Furthermore, in the case where the outer shape is the hexagon, the opposite sides of the sides 1b and the side 1e are preferably parallel to each other in the hexagon and parallel to the horizontal direction. Thus, when the light emitting element 1 is disposed so that the sides of the outer shape are partially parallel to the upper side and the lower side of the bottom surface 23b of the recess portion 23a, the ratio of the light emitting element 1 does not become too small in the area required for disposing the light emitting element 1.

In other words, since the light emitting element 1 has the outer shape and is disposed as described above in the recess portion 23a, mounting efficiency of the light emitting element 1 can be improved in the mounting region of the package 2 in view of an area. Therefore, while the package 2 is small and thin similar to the conventional one, a higher output can be obtained in the light emitting device 100. Furthermore, instead of or in addition to the effect of obtaining the higher output, the light emitting device 100 can be smaller or thinner than the conventional one.

Method of Manufacturing Light Emitting Device

Figure 6A:
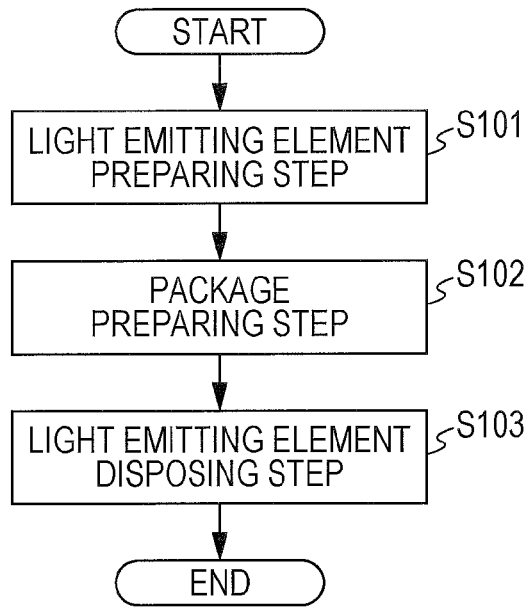
FIG. 6A is a schematic flowchart illustrating procedures of a method of manufacturing the light emitting device according to the first embodiment.
Figure 6B:
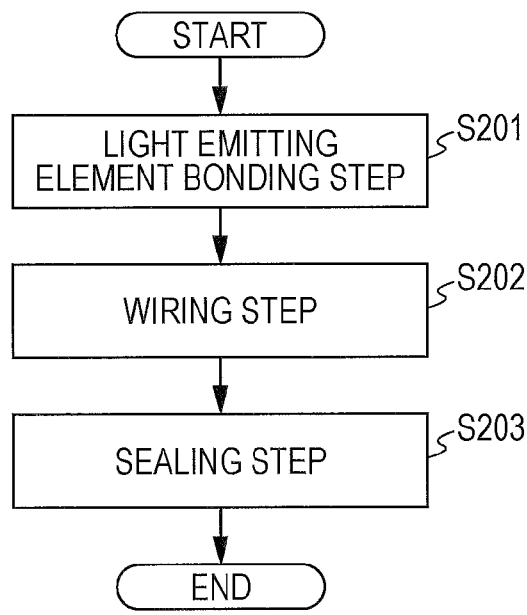
FIG. 6B is a schematic flowchart illustrating a detail of a light emitting element disposing step in the method of manufacturing the light emitting device according to the first embodiment.
Figure 8A:
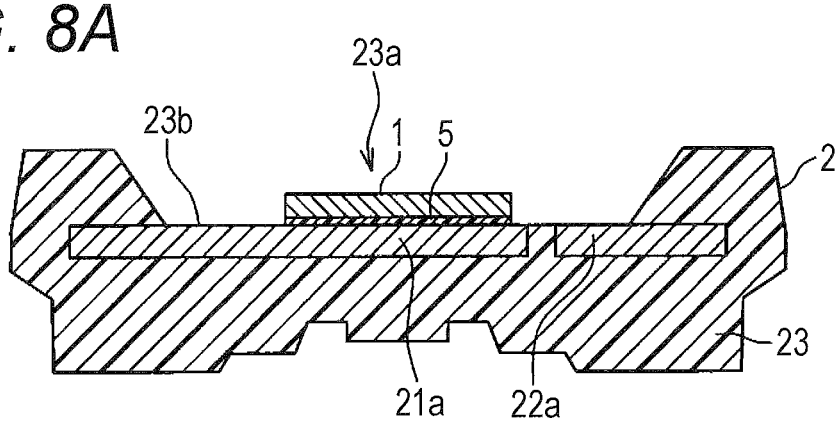
FIG. 8A is a schematic cross-sectional view illustrating a light emitting element bonding step as a sub-step in the light emitting element disposing step in the method of manufacturing the light emitting device according to the first embodiment.
Figure 8B:
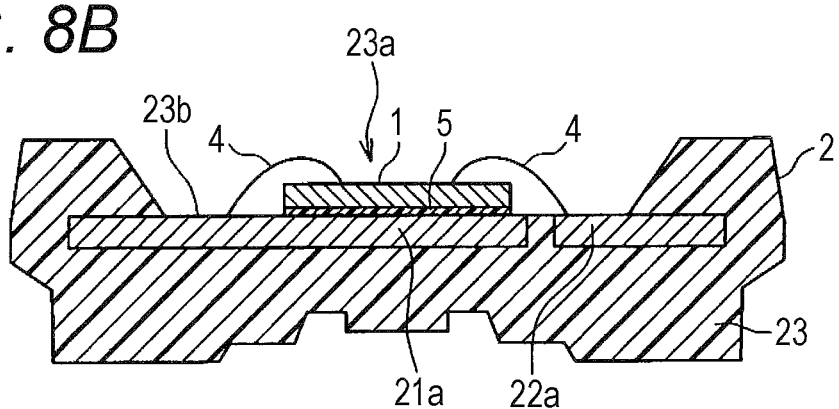
FIG. 8B is a schematic cross-sectional view illustrating a wiring step as a sub-step in the light emitting element disposing step in the method of manufacturing the light emitting device according to the first embodiment.
Figure 8C:
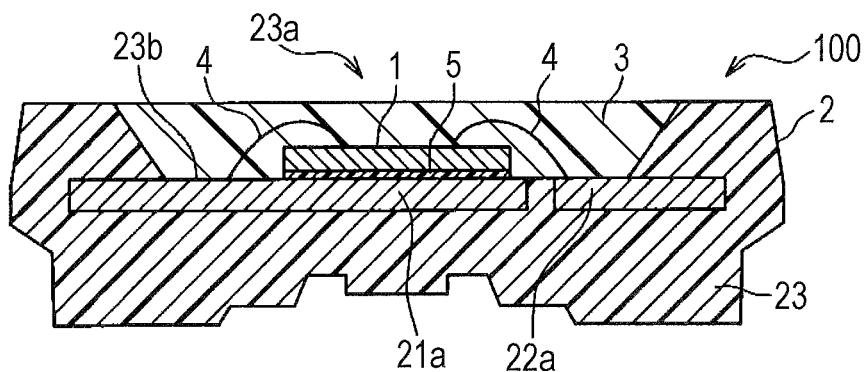
FIG. 8C is a schematic cross-sectional view illustrating a sealing step as a sub-step in the light emitting element disposing step in the method of manufacturing the light emitting device according to the first embodiment.

Hereinafter, a method of manufacturing the light emitting device 100 will be described with reference to FIGS. 6A to 8C. FIG. 6A is a schematic flowchart illustrating procedures of the method of manufacturing the light emitting device according to the first embodiment. FIG. 6B is a schematic flowchart illustrating a detail of a light emitting element disposing step in the method for manufacturing the light emitting device according to the first embodiment. FIG. 7A is a schematic plan view illustrating boundary lines for virtually laying out a wafer, in a light emitting element preparing step in the method of manufacturing the light emitting device according to the first embodiment. FIG. 7B is a schematic plan view illustrating a state where the light emitting elements are formed on the wafer, in the light emitting element preparing step in the method of manufacturing the light emitting device according to the first embodiment. FIG. 8A is a schematic cross-sectional view illustrating a light emitting element bonding step as a sub-step, in the light emitting element disposing step in the method of manufacturing the light emitting device according to the first embodiment. FIG. 8B is a schematic cross-sectional view illustrating a wiring step as a sub-step, in the light emitting element disposing step in the method of manufacturing the light emitting device according to the first embodiment. FIG. 8C is a schematic cross-sectional view illustrating a sealing step as a sub-step, in the light emitting element disposing step in the method of manufacturing the light emitting device according to the first embodiment.

Method of Manufacturing Light Emitting Device

The method of manufacturing the light emitting device 100 according to the first embodiment includes a light emitting element preparing step S101, a package preparing step S102, and a light emitting element disposing step S103.

In the light emitting element preparing step S101, the singulated light emitting element 1 is prepared so as to have the configuration illustrated in FIGS. 4A to 4C.

Hereinafter, a step example for manufacturing the light emitting element 1 in a wafer level process will be described, but the present invention is not limited to this. In addition, in manufacturing the light emitting elements 1 in the wafer level process, for example as illustrated in FIG. 7A, the boundary lines BD are provided as the virtual lines to lay out the respective light emitting elements 1, thereby forming the plurality of light emitting elements 1 each having the same shape.

Method of Manufacturing Semiconductor Stacked Body

Specifically, the semiconductor stacked body 12 is first formed on the substrate 11 made of sapphire, by a MOCVD method with the n-type semiconductor layer 12n, the active layer 12a, and the p-type semiconductor layer 12p made of the above-described semiconductor material and sequentially stacked. After that, the p-type semiconductor layer 12p is subjected to an annealing process to form the p-type layer.

N-Type Semiconductor Layer Exposing Step

After the semiconductor stacked body 12 is formed, the step difference portion 12b in which the n-type semiconductor layer 12n is exposed on the bottom surface is formed in a part of a region of the surface of the semiconductor stacked body 12 by etching away all of the p-type semiconductor layer 12p and the active layer 12a and a part of the n-type semiconductor layer 12n from the upper surface.

Insulating Film Forming Step

Next, the insulating film 15 is formed of insulating material such as $SiO_2$ on the upper surface of the p-type semiconductor layer 12p by a sputtering method so as to be provided under the p-side pad electrode 142 and its vicinity.

Light-Transmissive Electrode Forming Step

After that, the light-transmissive electrode 141 is formed of the light-transmissive electrically conductive material such as ITO by a sputtering method so as to cover the substantially entire upper surface of the p-type semiconductor layer 12p.

P-Side Pad Electrode Forming Step

Furthermore, the pad electrode 142 is formed of metal material such as Cu or Au on a part of the upper surface of the light-transmissive electrode 141 by a sputtering method, whereby the p-side electrode 14 is formed.

N-Side Pad Electrode Forming Step

Furthermore, the light reflecting film 131 is formed of metal material having a high light reflectivity such as Al, in the step difference portion 12b by a sputtering method, and the pad electrode 132 is formed of metal material such as Cu or Au on the upper surface of the light reflecting film 131 by a sputtering method, whereby the n-side electrode 13 is formed.

In addition, either the n-side electrode 13 or the p-side electrode 14 may be formed first, or, for example, the pad electrode 132 and the pad electrode 142 may be formed in the same step as a sub-step.

Protective Film Forming Step

Next, the protective film 16 is formed of light-transmissive insulating material such as $SiO_2$ by a sputtering method so as to cover the whole wafer except for the regions of the external connection openings 16n and 16p which are formed in the upper surfaces of the pad electrode 132 and the pad electrode 142, respectively.

Furthermore, the n-side electrode 13, the p-side electrode 14, the insulating film 15, and the protective film 16 can be each patterned by an etching method or lift-off method, with a mask formed into an appropriate shape by a photolithography method.

Through the sub-steps, the light emitting elements 1 can be formed on the wafer as illustrated in FIG. 7B.

Singulating Step

Next, the light emitting element 1 is singulated by cutting the wafer along the boundary lines BD. In this singulating step, when the light emitting element 1 having the non-rectangular shape is singulated, a laser dicing method is preferably used because it can cut the wafer along a polygonal line. By laying out the plurality of light emitting elements 1 densely along the polygonal lines, the number of the light emitting elements 1 per wafer can be increased.

In addition, the boundary line BD may be set so that the light emitting element 1 can be singulated only by cutting the wafer along a straight line by a dicing method or scribing method with a dicing saw.

Furthermore, the wafer may be thinned by grinding the back surface of the substrate 11 before it is cut. Thus, the wafer can be easily cut.

The laser dicing method is performed such that a laser light beam (preferably femtosecond pulse laser light beam) is emitted and concentrated at an inside of the substrate 11 to alter the substrate 11 in a vicinity of the concentrated region to form a cut groove. By irradiating the substrate 11 with the laser light beam along the boundary line BD, the cut groove can be formed along the polygonal line in the substrate 11. After that, a stress is applied to the substrate 11 with, for example, a roller or the like, and the wafer is separated based on the cut groove formed along the boundary line BD.

In addition, the method of cutting the wafer into the non-rectangular shape by the laser dicing method is described in detail in Japanese Unexamined Patent Application Publication No. 2006-135309 for example, so that further description is omitted here.

In the package preparing step S102, the package 2 in the light emitting device 100 illustrated in FIGS. 1 to 3B is prepared. The package 2 to be prepared in this step does not have the light emitting element 1 and sealing resin 3 yet.

In the package preparing step S102, the package 2 may be manufactured with a die by a molding method such as transfer molding method, injection molding method, compression molding, or extrusion molding, or may be a commercially available package.

Furthermore, as for the light emitting element preparing step S101 and the package preparing step S102, either one may be performed first, or both may be performed in parallel.

One example of the method of manufacturing the package 2 will be described. The package 2 may be manufactured such that a lead frame (lead electrodes 21 and 22) formed by punching out a plate is sandwiched by upper and lower dies having a hollow space corresponding to the shape of the resin portion 23, the resin material is injected from a gate hole provided in a part of the die, and the injected resin material is hardened or solidified and taken out of the dies. Furthermore, in a case where the plurality of packages 2 are manufactured in a connected state with the lead frame, the package 2 is singulated by cutting the lead frame.

The method of manufacturing the package with the die is described in detail in Japanese Unexamined Patent Application Publication No. 2008-72074 for example, so that further description is omitted here.

In the light emitting element disposing step S103, the light emitting element 1 prepared in the light emitting element preparing step S101 is mounted in the recess portion 23a of the package 2 prepared in the package preparing step S102. More specifically, the light emitting element disposing step S103 includes a light emitting element bonding step S201, a wiring step S202, and a sealing step S203 as sub-steps.

First, in the light emitting element bonding step S201, the light emitting element 1 is bonded to the upper surface of the internal lead portion 21a on the bottom surface 23b of the recess portion 23a in the package 2, with the die bond resin 5 (preferably the silicone-based die bond resin). At this time, an appropriate amount of the die bond resin 5 is supplied to the bonding position in the upper surface of the internal lead portion 21a, with a dispenser or transfer pin. Then, the light emitting element 1 is conveyed with a collet to the bonding position on which the die bond resin 5 has been provided, with the surface having the n-side electrode 13 and the p-side electrode 14 facing upward. Then, the surface having the substrate 11 is bonded to the upper surface of the internal lead portion 21a under the condition that the long-side direction of the light emitting element 1 is substantially parallel to the long-side direction of the bottom surface 23b of the recess portion 23a.

Subsequently, in the wiring step S202, the wire 4 is arranged so that the n-side electrode 13 and the p-side electrode 14 of the light emitting element 1 are electrically connected to the internal lead portions 21a and 22a of the negative and positive lead electrodes 21 and 22, respectively. The wire 4 may be arranged with a wire bonding device.

Subsequently, in the sealing step S203, the liquid-state sealing resin 3 is filled in the recess portion 23a of the package 2 by a potting method, and then the sealing resin 3 is hardened, whereby the light emitting element 1 is sealed. The sealing resin 3 may be prepared by adding particles of a fluorescent material (wavelength conversion material) and particles of a light diffusing material into the light-transmissive resin.

Through the above-described procedures, the light emitting device 100 can be manufactured.

Variations

Hereinafter, the variations of the light emitting element 1 mounted on the light emitting device 100 according to the first embodiment will be described with reference to FIGS. 9A to 9E.

Figure 9A:
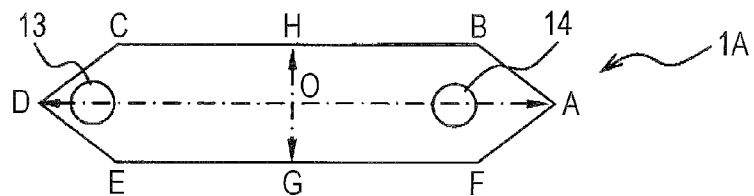
FIG. 9A is a schematic plan view illustrating another example of a light emitting element to be used in the light emitting device according to the first embodiment.
Figure 9B:
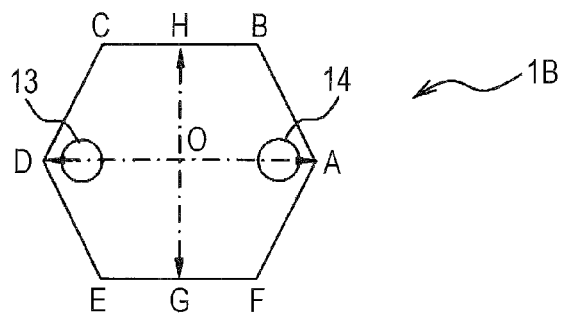
FIG. 9B is a schematic plan view illustrating another example of a light emitting element to be used in the light emitting device according to the first embodiment.
Figure 9C:
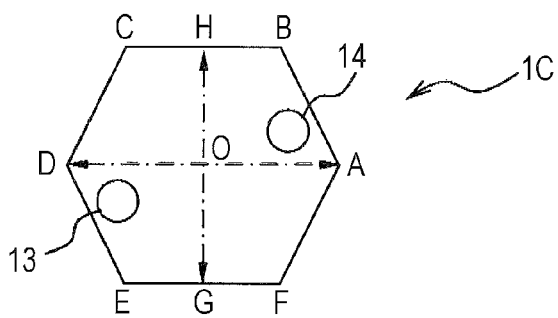
FIG. 9C is a schematic plan view illustrating another example of a light emitting element to be used in the light emitting device according to the first embodiment.
Figure 9D:
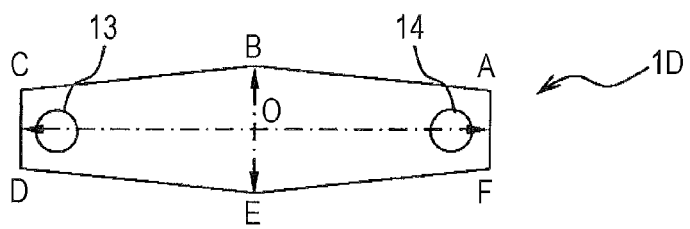
FIG. 9D is a schematic plan view illustrating another example of a light emitting element to be used in the light emitting device according to the first embodiment.
Figure 9E:
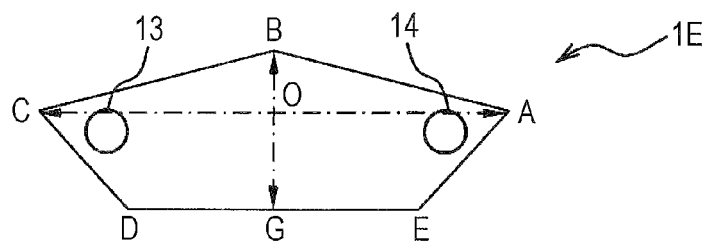
FIG. 9E is a schematic plan view illustrating another example of a light emitting element to be used in the light emitting device according to the first embodiment.

FIG. 9A is a schematic plan view illustrating another example of the light emitting element to be used in the light emitting device according to the first embodiment. FIG. 9B is a schematic plan view illustrating another example of the light emitting element to be used in the light emitting device according to the first embodiment. FIG. 9C is a schematic plan view illustrating another example of the light emitting element to be used in the light emitting device according to the first embodiment. FIG. 9D is a schematic plan view illustrating another example of the light emitting element to be used in the light emitting device according to the first embodiment. FIG. 9E is a schematic plan view illustrating another example of the light emitting element to be used in the light emitting device according to the first embodiment.

In addition, FIGS. 9A to 9E illustrate light emitting elements 1A to 1E in the variations, respectively, in which outer shapes in planar view and the pad electrodes to be externally connected in the n-side electrodes 13 and the p-side electrode 14 are only illustrated, and other detailed configurations are not illustrated. Furthermore, in the light emitting elements 1A to 1E, A to F represent apexes of a polygon as the outer shape in planar view, O represents a center of the outer shape in a long-side direction, and G and H represent ends of a line passing through the center O in a short-side direction. Furthermore, in each of the light emitting elements 1A to 1E, as illustrated by one-dot chain lines in the drawing, a horizontal direction is the long-side direction, and a vertical direction is the short-side direction. Therefore, each of the light emitting elements 1A to 1E is disposed on the bottom surface 23b so that the horizontal direction is substantially parallel to the long-side direction of the bottom surface 23b of the recess portion 23a in the package 2.

The light emitting elements 1A to 1D each has a convex hexagonal outer shape, and the light emitting element 1E has a convex pentagonal outer shape.

The light emitting element 1A has the horizontally long hexagonal outer shape similar to the light emitting element 1 illustrated in FIG. 4C, in which a side BC and a side EF are a pair of horizontally parallel opposite sides and longer than other sides AB, CD, DE, and FA. Thus, when the horizontally parallel opposite sides BC and EF are made relatively longer, a ratio of an area of the light emitting element 1A can be increased in an area required for disposing the light emitting element 1A in the horizontally long bottom surface 23b. Furthermore, since the other sides are not parallel to the horizontal direction, light irradiation intensity can be reduced in the inner side surfaces of the upper wall portion 23c and the lower wall portion 23d of the recess portion 23a.

The light emitting element 1B has a regular hexagonal outer shape. Even in the case of the regular hexagon other than the horizontally long hexagon of the light emitting element 1 or the light emitting element 1A, a diagonal line AD is longer than a distance between opposite sides, that is, a line segment GH. Therefore, when a direction of the diagonal line AD is parallel to the long-side direction, the same effect as the light emitting element 1 or the light emitting element 1A can be obtained.

The light emitting element 1C has a regular hexagonal outer shape similar to the light emitting element 1B. In the case of the light emitting element 1B, each of the n-side electrode 13 and the p-side electrode 14 is provided in a vicinity of an end of the diagonal line AD in the long-side direction. Meanwhile, in the case of the light emitting element 1C, as for a horizontal direction, the n-side electrode 13 and the p-side electrode 14 are provided in vicinities of ends of the diagonal line AD parallel to the long-side direction, but as for a vertical direction, they are shifted downward and upward from the diagonal line AD, respectively.

Thus, each of the n-side electrode 13 and the p-side electrode 14 may be shifted from the same straight line parallel to the long-side direction.

The light emitting element 1D has a horizontally long hexagonal outer shape provided by extending a distance between a pair of opposite sides FA and CD of the regular hexagon to elongate sides AB, BC, DE, and EF. Therefore, a direction vertical to sides FA and CD is parallel to a long-side direction, and a diagonal line BE is parallel to a short-side direction. Thus, when the light emitting element 1D is disposed so that the long-side direction of the hexagon is parallel to the long-side direction of the bottom surface 23b of the recess portion 23a, all of the sides AB, BC, DE, and EF are opposed to the upper side and the lower side of the bottom surface 23b so as not to be parallel to the upper side and the lower side of the bottom surface 23b. Therefore, the inner side surfaces of the upper wall portion 23c and the lower wall portion 23d is irradiated with the light from side surfaces corresponding to the sides AB, BC, DE, and EF of the light emitting element 1D with reduced intensity as a whole.

The light emitting element 1E has a horizontally long pentagonal outer shape provided by elongating a regular pentagon in a horizontal direction. As for the light emitting element 1E, sides AB and BC are opposed to the upper side of the bottom surface 23b so as not to be parallel to the upper side, and sides CD and EA are opposed to the lower side of the bottom surface 23b so as not to be parallel to the lower side. In addition, side DE is opposed to the lower side so as to be parallel thereto.

Thus, the light emitting element 1E may have the horizontally long convex polygon outer shape having the five or more sides instead of the hexagon outer shape.

As described in the first embodiment and its variations, each of the light emitting elements 1 to 1E has the convex polygonal outer shape (having five or more sides), and is disposed so that the long-side direction of the outer shape is substantially parallel to the long-side direction of the bottom surface 23b of the recess portion 23a, so that the ratio of the area of each of the light emitting elements 1 to 1E cannot be too small in the area required for disposing each of the light emitting elements 1 to 1E in the horizontally long bottom surface 23b. As a result, while the package 2 can be small or thin similar to the conventional one, an higher output can be obtained in the light emitting device having any one of the light emitting elements 1 to 1E.

Furthermore, it is preferable that one of the pair of pad electrodes in each of the light emitting elements 1 to 1E is provided in the vicinity of the one end in the long-side direction, and the other is provided in the vicinity of the other end in the long-side direction in the outer shape of each of the light emitting elements 1 to 1E. Thus, the wire 4 can be short in connecting each of the light emitting elements 1 to 1E to the internal lead portions 21a and 22a, and/or connecting the light emitting elements 1 to 1E to each other. Furthermore, the wire 4 can be arranged so as not to block the light emitted from the light emitting elements 1 to 1E. Thus, light absorption by the wire 4 can be reduced, so that the light from the light emitting elements 1 to 1E and the wavelength conversion material can be efficiently emitted to the outside. As a result, the output and the light extraction efficiency can be improved in the light emitting devices having any one of the light emitting elements 1 to 1E.

Second Embodiment

Figure 10:
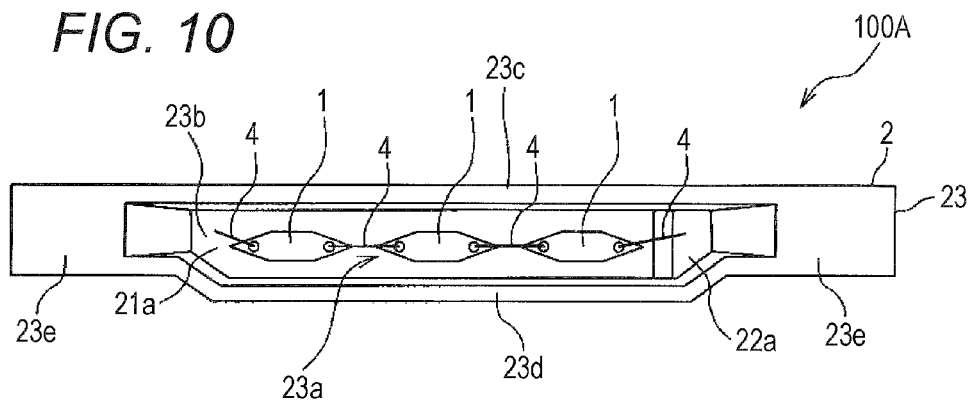
FIG. 10 is a schematic front view illustrating a configuration of a light emitting device according to a second embodiment.

Hereinafter, a light emitting device according to the second embodiment will be described with reference to FIG. 10. FIG. 10 is a schematic front view illustrating a configuration of the light emitting device according to the second embodiment.

In addition, an external lead portion and a sealing resin are not illustrated in FIG. 10.

According to a light emitting device 100A of the second embodiment, a plurality of (three in this example) light emitting elements 1 are arranged in a row in a long-side direction on a bottom surface 23b of a recess portion 23a in a package 2. The light emitting element 1 has a configuration similar to the light emitting element 1 in the light emitting device 100 according to the first embodiment, and disposed so that a long-side direction of a horizontally long hexagon is substantially parallel to the long-side direction of the bottom surface 23b of the recess portion 23a in the package 2. Therefore, inner side surfaces of an upper wall portion 23c and a lower wall portion 23d which sandwich the light emitting element 1 in a height direction (vertical direction in FIG. 10) are irradiated with light emitted from the light emitting element 1 with reduced intensity, so that a resin portion 23 can be prevented from deteriorating.

Furthermore, the light emitting elements 1 adjacent to each other in the horizontal direction are provided such that apexes of the hexagonal outer shapes are opposed to each other, and side surfaces are not parallel to each other in front view, so that the amount of the light emitted from the one light emitting element 1 entering the side surface of the other light emitting element 1 is reduced, and light extraction efficiency can be improved in the light emitting device 100A.

Furthermore, the three light emitting elements 1 is electrically connected to internal lead portions 21a and 22a in series with the wire 4. In this case, the negative and positive pad electrodes in the light emitting element 1 are preferably provided near the opposite ends in the long-side direction. Thus, the wire 4 can be short in connecting the light emitting elements 1 to each other and connecting the light emitting elements 1 to the internal lead portions 21a and 22a. In addition, the wire 4 can avoid largely covering the light emitting element 1 in a light extraction direction (direction to the opening surface of the recess portion 23a). Therefore, the light extraction is less hindered by the wire 4, and the light extraction efficiency can be improved in the light emitting device 100A.

The plurality of light emitting elements 1 is not necessarily connected in series, and may be connected in parallel or by another way.

In addition, except for the configuration in which the plurality of light emitting elements 1 are connected in series in the recess portion 23a of the package 2, the light emitting device 100A can be manufactured similarly to the light emitting device 100 according to the first embodiment, so that its manufacturing method is not described here.

Third Embodiment

Figure 11:
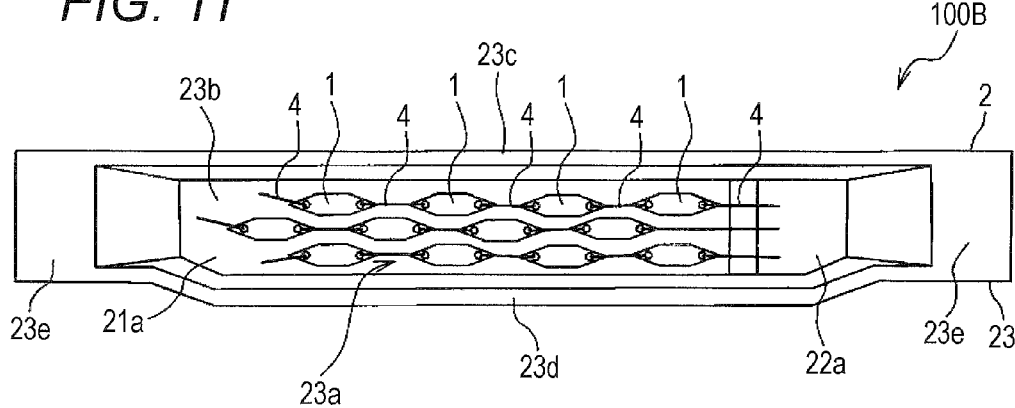
FIG. 11 is a schematic front view illustrating a configuration of a light emitting device according to a third embodiment.

Hereinafter, a light emitting device according to the third embodiment will be described with reference to FIG. 11. FIG. 11 is a schematic front view illustrating a configuration of the light emitting device according to the third embodiment.

In addition, an external lead portion and a sealing resin are not illustrated in FIG. 11.

According to a light emitting device 100B of the third embodiment, a plurality of (twelve in this example) light emitting elements 1 are provided in a bottom surface 23b of a recess portion 23a in a package 2 such that the four light emitting elements 1 are arranged in each row in a long-side direction, and three rows are provided in a short-side direction. Furthermore, in each row in the long-side direction, the four light emitting elements 1 are electrically connected to internal lead portions 21a and 22a in series with a wire 4.

The light emitting element 1 has a configuration similar to the light emitting element 1 in the light emitting device 100 according to the first embodiment, and disposed so that a long-side direction of a horizontally long hexagon is substantially parallel to a long-side direction of the bottom surface 23b of the recess portion 23a in the package 2. Therefore, inner side surfaces of an upper wall portion 23c and a lower wall portion 23d which sandwich the light emitting element 1 in a height direction (vertical direction in FIG. 11) are irradiated with light emitted from the light emitting element 1 with reduced intensity, so that a resin portion 23 can be prevented from deteriorating.

Furthermore, as for the light emitting elements 1 in the three rows, positions of the light emitting elements 1 are preferably shifted in the horizontal direction with respect to each row, that is, in a zigzag manner. In particular, in a case where the light emitting element 1 has the hexagonal outer shape in front view, a pair of opposite sides (sides BC and EF in FIG. 4C) of the hexagon is parallel, and the light emitting element 1 is disposed so that the pair of opposite sides is parallel to the horizontal direction, the one pair of opposite sides is prevented from being opposed to the other pair of opposite sides between the light emitting elements 1 adjacent in the vertical direction (positioned in the upper row and the lower row). Thus, the amount of the light emitted from the one light emitting element 1 entering the side surface of the other light emitting element 1 adjacent in the vertical direction is reduced, so that light extraction efficiency can be improved in the light emitting device 100B.

Furthermore, since the light emitting elements 1 adjacent in the horizontal direction are similar to the light emitting device 100A according to the second embodiment, the light is prevented from entering the adjacent light emitting elements 1 again, so that the light extraction efficiency can be improved in the light emitting device 100B.

Furthermore, similar to the light emitting element 1 in the light emitting device 100A according to the second embodiment, negative and positive pad electrodes in the light emitting element 1 are preferably provided near opposite ends in the long-side direction.

In addition, the plurality of light emitting elements 1 are not necessarily connected in series in every row, all of the light emitting elements 1 may be connected in series, all of the light emitting elements 1 may be connected in parallel, or another connection method may be used.

Furthermore, except for the configuration in which the plurality of light emitting elements 1 are disposed in the plurality of rows in the recess portion 23a of the package 2, the light emitting device 100B can be manufactured similarly to the light emitting device 100 according to the first embodiment, so that its manufacturing method is not described here.

Furthermore, instead of the light emitting element 1, the light emitting elements 1A to 1E having other outer shapes as illustrated in FIGS. 9A and 9E may be used in the light emitting device 100A in the second embodiment and the light emitting device 100B in the third embodiment.

Application

Configuration of Lighting Device

Figure 12:
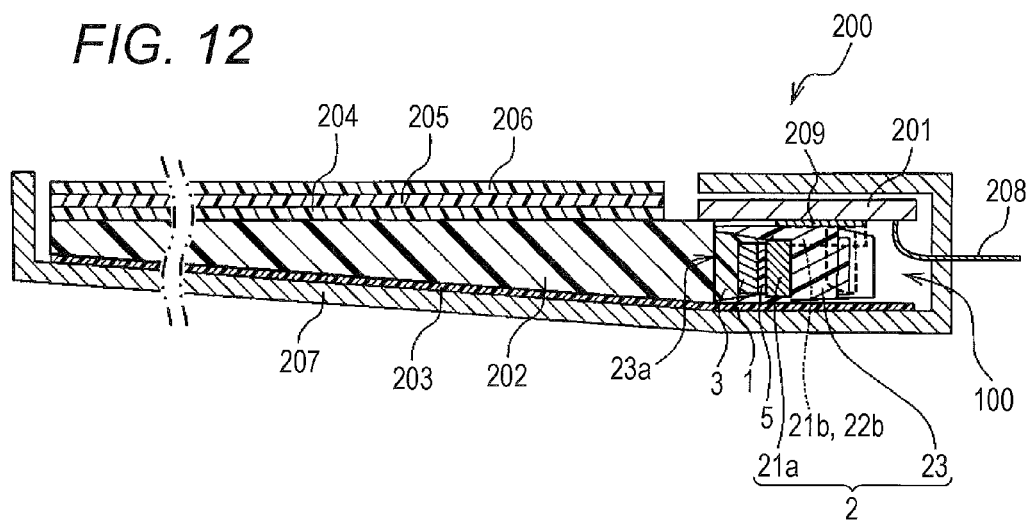
FIG. 12 is a schematic cross-sectional view illustrating a configuration of a lighting device having the light emitting device according to the first embodiment.

Hereinafter, as the application of the light emitting device according to each embodiment, the lighting device using the light emitting device will be described with reference to FIG. 12. FIG. 12 is a schematic cross-sectional view illustrating a configuration of the lighting device using the light emitting device according to the first embodiment.

The description will be given of the case where the light emitting device 100 according to the first embodiment is used in the application, but the light emitting devices 100A and 100B in the other embodiments and the light emitting devices in the variations may be used other than the light emitting device 100.

A lighting device 200 in this application is a surface emission type light source device which is suitable for a backlight such as a liquid crystal display device. The lighting device 200 includes a mounting substrate 201 on which the light emitting device 100 is mounted, a plate-shaped light guiding member 202, a light reflecting sheet 203 provided on lower surfaces of the light emitting device 100 and the light guiding member 202, and a light diffusing sheet 204 and prism sheets 205 and 206 stacked on an upper surface serving as a light extraction surface of the light guiding member 202. In addition, the lighting device 200 is housed in a frame 207 having an opening in an upper surface provided in a light emission direction. Furthermore, a wiring pattern of the mounting substrate 201 is connected to an external power supply through a lead 208, and external lead portions 21*b* and 22*b* of the light emitting device 100 are electrically connected to the negative and positive wiring patterns of the mounting substrate 201, respectively with an electrically conductive bonding member 209 such as solder.

The light guiding member 202 is made of light-transmissive resin and has a tapered cross-sectional shape in which a thickness is reduced from a light incident end surface (right surface) toward an its opposed surface (left surface). The light incident end surface of the light guiding member 202 is disposed so as to adhere with an opening surface of a recess portion 23*a* serving as a light emission surface of the light emitting device 100, and the light incident end surface is roughly the same height as a height of the light emitting device 100. The light emitted from the light emitting device 100 enters the light guiding member 202 through the light incident end surface, repeats reflection and diffusion while traveling inside the light guiding member 202, and is emitted from the upper surface of the light guiding member 202.

Furthermore, the light reflecting sheet 203 is made of resin, has a reflecting film made of Ag or Al on its surface, and functions to make light leaked from the light emitting device 100 or the light guiding member 202 return to those members to enhance the light use efficiency. The light diffusing sheet 204 functions to make a uniform intensity distribution of the light emitted from the upper surface of the light guiding member 202. The prism sheets 205 and 206 are made of light-transmissive resin, have many fine triangle prisms, and function to refract and collect the incident light from below, into a normal direction of a sheet surface. The prism sheets 205 and 206 are disposed so that the light refracting directions intersect at right angle with each other. The frame 207 is formed into a box shape by bending a plate made of Al or stainless steel.

As described above, the light emitting device 100 includes the resin material of the package 2 which is not likely to be damaged by the light from the light emitting element 1, so that high efficiency and a long lifetime can be achieved. Therefore, the lighting device 200 having the light emitting device 100 can serve as a surface emission type light source having high efficiency and a long lifetime.

In the above, the light emitting device has been specifically described by use of the embodiments, but the present invention is not limited to the description and needs to be widely interpreted based on a description in the claim. Furthermore, the present invention includes various modifications and variations made based on the description, as a matter of course.

A light emitting device according to an embodiment of the present invention includes: a package having a recess portion which has a horizontally long bottom surface, is open in a front direction vertical to the bottom surface, and has resin-based inner walls around the bottom surface; and a light emitting element disposed on the bottom surface of the recess portion and having a polygonal shape having five or more sides and a long-side direction and a short-side direction in front view in which every internal angle is less than 180°. In a case where a short-side direction of the bottom surface of the recess portion is a vertical direction, and a long-side direction of the bottom surface of the recess portion is a horizontal direction, the light emitting element is disposed such that the long-side direction of the light emitting element is parallel to the horizontal direction in front view.

The light emitting device according to the embodiment of the present invention achieves high efficiency as well as miniaturization.

Obviously, numerous modifications and variations of the present invention are possible in light of the above teachings. It is therefore to be understood that within the scope of the appended claims, the invention may be practiced otherwise than as specifically described herein.

What is claimed is:

1. A light A light emitting device comprising:
    a package including a recess portion which has a bottom surface, an opening on a front side opposite to the bottom surface in a front direction perpendicular to the bottom surface, and an inner peripheral wall connecting the bottom surface and the front side, the bottom surface having distances between opposite sides of the bottom surface and having a longest distance among the distances; and
    at least one light emitting element disposed on the bottom surface of the recess portion and having a polygonal shape which has five or more sides viewed along the front direction, each internal angle of the polygonal shape being less than 1800, the five or more sides including a third side and a fourth side opposite to the third side along the longest distance, the third side and the fourth side being perpendicular to a lateral line along the longest distance, the polygonal shape having a width between the third side and the fourth side along the lateral line and a longest height parallel to the third side, the width being longer than the longest height.

2. The light emitting device according to claim 1, wherein the at least one light emitting element has a hexagonal shape.

3. The light emitting device according to claim 2,
    wherein the hexagonal shape has a first side and a second side opposite to and parallel to the first side, and
    wherein the at least one light emitting element is disposed such that the first side and the second side are parallel to the lateral line.

4. The light emitting device according to 1, wherein the at least one light emitting element comprises a plurality of the light emitting elements which are disposed in one row or a plurality of rows in the lateral line.

5. The light emitting device according to claim 3,
    wherein the at least one light emitting element comprises a plurality of the light emitting elements which are disposed in a plurality of rows in the lateral line in a zigzag manner,
    wherein laterally adjacent light emitting elements arranged in the lateral line among the plurality of the light emitting elements are disposed such that apexes of the laterally adjacent light emitting elements are opposed to each other viewed along the front direction, and
    wherein perpendicularly adjacent light emitting elements arranged in a line perpendicular to the front direction and the lateral line among the plurality of the light emitting elements are disposed such that sides except for the first side and the second side are opposed to each other viewed along the front direction.

6. The light emitting device according to claim 1,
    wherein the at least one light emitting element comprises a first external connection electrode and a second external connection electrode, and wherein the first external connection electrode is provided at a first end portion in a direction along the lateral line and the second external connection electrode is provided in a second end portion opposite to the first end portion in the direction along the lateral line.

7. The light emitting device according to claim 1, wherein the at least one light emitting element is bonded to the bottom surface of the package with a die bond resin including silicone.

8. The light emitting device according to claim 7,
wherein the at least one light emitting element is sealed with a sealing resin, and
wherein a refractive index of the die bond resin is equal to or less than a refractive index of the sealing resin.

9. The light emitting device according to claim 1, wherein the inner peripheral wall is made of resin.

10. The light emitting device according to claim 1, wherein the five or more sides have a first side parallel to the longest diagonal line, the first side being longer than any sides non-parallel to the longest diagonal line.

11. A light emitting device comprising:
a package including a recess portion which has a bottom surface, an opening on a front side opposite to the bottom surface in a front direction perpendicular to the bottom surface, and an inner peripheral wall connecting the bottom surface and the front side, the bottom surface having distances between opposite sides of the bottom surface and having a longest distance among the distances; and
at least one light emitting element disposed on the bottom surface of the recess portion and having a polygonal shape which has five or more sides viewed along the front direction, each internal angle of the polygonal shape being less than 180°, the five or more sides including a third side and a fourth side opposite to the third side along the longest distance, the third side and the fourth side being perpendicular to a lateral line along the longest distance, the polygonal shape having a width between the third side and the fourth side along the lateral line and a longest height parallel to the third side, the width being longer than the longest height.

12. The light emitting device according to claim 11, wherein the at least one light emitting element has a hexagonal shape.

13. The light emitting device according to 11, wherein the at least one light emitting element comprises a plurality of the light emitting elements which are disposed in one row or a plurality of rows in the lateral line.

14. The light emitting device according to claim 11,
wherein the at least one light emitting element comprises first external connection electrode and a second external connection electrode, and
wherein the first external connection electrode is provided at a first end portion in a direction along the lateral line and the second external connection electrode is provided in a second end portion opposite to the first end portion in the direction along the lateral line.

15. The light emitting device according to claim 11, wherein the at least one light emitting element is bonded to the bottom surface of the package with a die bond resin including silicone.

16. The light emitting device according to claim 15,
wherein the at least one light emitting element is sealed with a sealing resin, and
wherein a refractive index of the die bond resin is equal to or less than a refractive index of the sealing resin.

17. The light emitting device according to claim 11, wherein the inner peripheral wall is made of resin.

18. The light emitting device according to claim 11, wherein the third side and the fourth side are shorter than any other sides of the five or more sides.

* * * * *

UNITED STATES PATENT AND TRADEMARK OFFICE
CERTIFICATE OF CORRECTION

PATENT NO. : 9,761,764 B2
APPLICATION NO. : 15/005005
DATED : September 12, 2017
INVENTOR(S) : Masaki Hayashi et al.

It is certified that error appears in the above-identified patent and that said Letters Patent is hereby corrected as shown below:

In the Claims

Claim 1, Column 24, Line 13, "A light A light emitting device" should be changed to --A light emitting device--;

Claim 1, Column 24, Line 24, "five or more sides" should be changed to --five or more sides and which has a longest diagonal line--;

Claim 1, Column 24, Lines 26-33, "180°, the five or more sides including a third side and a fourth side opposite to the third side along the longest distance, the third side and the fourth side being perpendicular to a lateral line along the longest distance, the polygonal shape having a width between the third side and the fourth side along the lateral line and a longest height parallel to the third side, the width being longer than the longest height" should be changed to --180°, the at least one light emitting element being disposed such that the longest diagonal line of the polygonal shape is parallel to a lateral line along the longest distance--.

Signed and Sealed this
Twenty-first Day of November, 2017

Joseph Matal
*Performing the Functions and Duties of the
Under Secretary of Commerce for Intellectual Property and
Director of the United States Patent and Trademark Office*